United States Patent
Brewer

(10) Patent No.: US 11,935,869 B2
(45) Date of Patent: Mar. 19, 2024

(54) POWER AND TEMPERATURE MANAGEMENT FOR FUNCTIONAL BLOCKS IMPLEMENTED BY A 3D STACKED INTEGRATED CIRCUIT

(71) Applicant: Micron Technology, Inc., Boise, ID (US)

(72) Inventor: Tony M. Brewer, Plano, TX (US)

(73) Assignee: Micron Technology, Inc., Boise, ID (US)

(*) Notice: Subject to any disclaimer, the term of this patent is extended or adjusted under 35 U.S.C. 154(b) by 204 days.

(21) Appl. No.: 17/408,230

(22) Filed: Aug. 20, 2021

(65) Prior Publication Data

US 2021/0384165 A1 Dec. 9, 2021

Related U.S. Application Data

(63) Continuation of application No. 16/942,619, filed on Jul. 29, 2020, now Pat. No. 11,114,416, which is a continuation of application No. 16/169,915, filed on Oct. 24, 2018, now Pat. No. 10,748,874.

(51) Int. Cl.
| | | |
|---|---|---|
| H01L 27/06 | (2006.01) | |
| H01L 25/065 | (2023.01) | |
| H01L 27/02 | (2006.01) | |
| H10B 12/00 | (2023.01) | |

(52) U.S. Cl.
CPC ...... *H01L 25/0657* (2013.01); *H01L 27/0248* (2013.01); *H01L 27/0688* (2013.01); *H10B 12/50* (2023.02)

(58) Field of Classification Search
CPC ............ H01L 27/0657; H01L 27/0248; H01L 27/0688; H01L 27/10897
USPC .......................................................... 257/686
See application file for complete search history.

(56) References Cited

U.S. PATENT DOCUMENTS

| | | | |
|---|---|---|---|
| 10,115,437 B1 * | 10/2018 | Yuan | G11C 5/005 |
| 10,152,262 B2 | 12/2018 | Qawami et al. | |
| 10,461,076 B1 | 10/2019 | Brewer | |
| 10,748,874 B2 | 8/2020 | Brewer | |
| 10,840,240 B2 | 11/2020 | Brewer | |
| 11,114,416 B2 | 9/2021 | Brewer | |
| 2010/0199017 A1 | 8/2010 | Hollis | |
| 2012/0151134 A1 | 6/2012 | Friendshuh et al. | |
| 2014/0103505 A1 | 4/2014 | Zhao et al. | |
| 2014/0136903 A1 | 5/2014 | Hyde et al. | |
| 2014/0181439 A1 * | 6/2014 | Moon | G11C 11/4087 711/162 |

(Continued)

OTHER PUBLICATIONS

International Search Report and Written Opinion, PCT/US2019/056810, dated Feb. 5, 2020.

(Continued)

*Primary Examiner* — Phuc T Dang
(74) *Attorney, Agent, or Firm* — Greenberg Traurig

(57) ABSTRACT

A three-dimensional stacked integrated circuit (3D SIC) having a non-volatile memory die, a volatile memory die, a logic die, and a thermal management component. The non-volatile memory die, the volatile memory die, the logic die, and the thermal management component are stacked. The thermal management component can be stacked in between the non-volatile memory die and the logic die, stacked in between the volatile memory die and the logic die, or both.

25 Claims, 11 Drawing Sheets

(56) References Cited

U.S. PATENT DOCUMENTS

| | | | |
|---|---|---|---|
| 2014/0262192 A1 | 9/2014 | Boday et al. | |
| 2015/0194224 A1 | 7/2015 | Jeddeloh | |
| 2015/0236002 A1 | 8/2015 | Haba et al. | |
| 2015/0303174 A1 | 10/2015 | Yu et al. | |
| 2016/0064063 A1* | 3/2016 | Nomura | G11C 11/40618 365/189.011 |
| 2016/0123816 A1* | 5/2016 | Pei | G01J 5/12 374/121 |
| 2017/0140821 A1 | 5/2017 | Mazed | |
| 2017/0236804 A1 | 8/2017 | Hembree | |
| 2017/0287873 A1 | 10/2017 | Sankarasubramanian et al. | |
| 2017/0322749 A1 | 11/2017 | Qawami et al. | |
| 2018/0096971 A1 | 4/2018 | Pappu et al. | |
| 2018/0130744 A1 | 5/2018 | Chen et al. | |
| 2018/0190353 A1 | 7/2018 | Srinivasan et al. | |
| 2019/0004729 A1 | 1/2019 | Qawami et al. | |
| 2019/0042799 A1 | 2/2019 | Durham et al. | |
| 2019/0214423 A1 | 7/2019 | Kim et al. | |
| 2019/0221520 A1 | 7/2019 | Kim et al. | |
| 2020/0135697 A1 | 4/2020 | Brewer | |
| 2020/0135719 A1 | 4/2020 | Brewer | |
| 2020/0365562 A1 | 11/2020 | Brewer | |
| 2021/0050347 A1 | 2/2021 | Brewer | |

OTHER PUBLICATIONS

Power and Temperature Management for Functional Blocks Implemented by a 3D Stacked Integrated Circuit, U.S. Appl. No. 16/169,915, filed Oct. 24, 2018, Tony Brewer, Patented Case, Nov. 19, 2019.

Power and Temperature Management For Functional Blocks Implemented by a 3D Stacked Integrated Circuit, U.S. Appl. No. 16/942,619, filed Jul. 29, 2020, Tony Brewer, Patented Case, Jan. 12, 2021.

* cited by examiner

POWER AND TEMPERATURE MANAGEMENT FOR FUNCTIONAL BLOCKS IMPLEMENTED BY A 3D STACKED INTEGRATED CIRCUIT

CROSS REFERENCE TO RELATED MATTERS

The present application is a continuation application of U.S. patent application Ser. No. 16/942,619 filed Jul. 29, 2020, issued as U.S. Pat. No. 11,114,416 on Sep. 7, 2021, which is a continuation application of U.S. patent application Ser. No. 16/169,915 filed Oct. 24, 2018, issued as U.S. Pat. No. 10,748,874 on Aug. 18, 2020, both entitled "Power and Temperature Management for Functional Blocks Implemented by a 3D Stacked Integrated Circuit", the entire disclosures of which applications are hereby incorporated herein by reference.

FIELD OF THE TECHNOLOGY

At least some embodiments disclosed herein relate to power and temperature management of three-dimensional integrated circuits (3D ICs) in general, and more particularly, but not limited to power and temperature management of three-dimensional stacked integrated circuits (3D SICs).

BACKGROUND

Electronic devices and circuitry, including 3D ICs and 3D SICs, generate excess heat and thus require thermal management to improve reliability and prevent premature failure. And, the amount of heat output corresponds to the power input of a device or circuit in general. Thus, temperature and power management of electronic devices and circuitry are closely related. There are many known technologies and combination of technologies for reducing the temperature of electronic devices and circuits, including many different types of heat sinks, cooling plates, passive systems, active systems (such as forced air systems and assemblies including fans), heat pipes, and many others. And, in cases of very low environmental temperatures, it may be necessary to keep the electronic components of devices and circuitry warm to achieve satisfactory operation and prevent premature damage and wear.

A 3D IC is an integrated circuit built by stacking silicon dies and interconnecting them vertically so that a combination of the dies is a single device. With a 3D IC, electrical paths through the device can be shortened by its vertically layout, which creates a device that can be faster and has a smaller footprint than similar ICs arranged side-by-side. 3D ICs can be generally grouped into 3D SICs, which refers to stacked ICs with through-silicon via interconnects (TSVs), and monolithic 3D ICs, which are generated using fabrication processes to realize 3D interconnects at the local levels of the on-chip wiring hierarchy as set forth by the International Technology Roadmap for Semiconductors (ITRS). Using the fabrication processes to realize the 3D interconnects can produce direct vertical interconnects between device layers. Monolithic 3D ICs are built in layers on a single wafer that is diced into separate 3D ICs.

3D SICs can be produced by three known general methods: a die-to-die, die-to-wafer, or a wafer-to-wafer method. In a die-to-die method, electronic components are generated on multiple dies. Then, the dies are aligned and bonded. A benefit of a die-to-die method is that each die can be tested before aligned and bonded with another die. In a die-to-wafer method, electronic components are generated on multiple wafers. One of the wafers can be diced and then aligned and bonded on to die sites of another wafer, accordingly. In a wafer-to-wafer method, electronic components are generated on multiple wafers, which are then aligned, bonded, and diced into separate 3D ICs.

A TSV is a vertical electrical connection that can pass through a die. TSVs can be a central part to increasing performance in 3D packages and 3D ICs. With TSVs, compared to alternatives for connecting stacked chips, the interconnect and device density can be substantially higher, and the length of the connections can be shorter.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
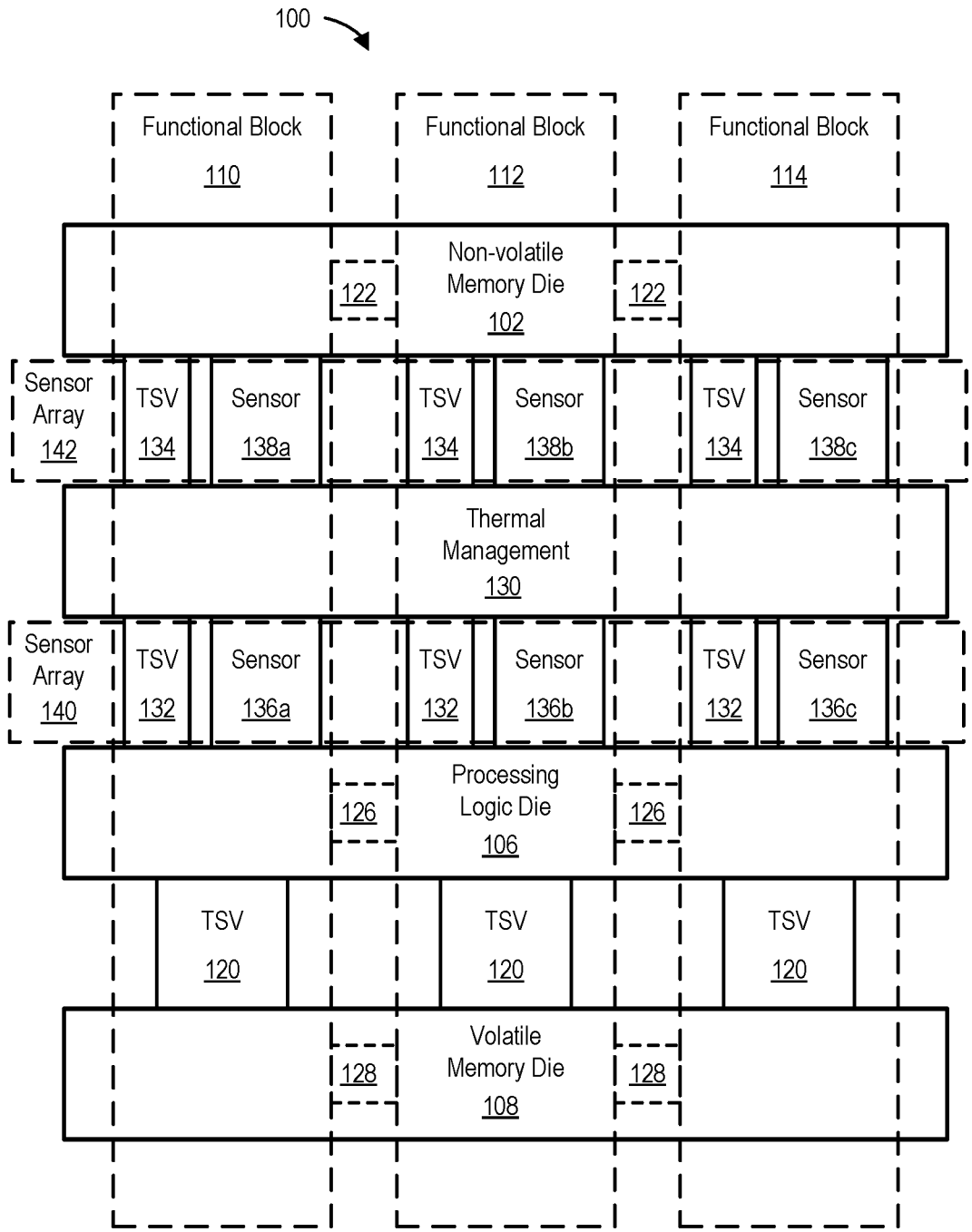
FIG. 1 illustrates a front view of an example 3D SIC having a non-volatile memory die, a volatile memory die, a processing logic die, and a thermal management component in accordance with some embodiments of the present disclosure.

At least some aspects of the present disclosure are directed to power and/or temperature management of functional blocks implemented by a 3D SIC. Also, in general, aspects of the present disclosure are directed to power and/or temperature management of functional blocks implemented by a 3D IC.

In general, a 3D IC is an integrated circuit manufactured by stacking silicon wafers or dies and interconnecting them in a first direction (e.g., vertically) using, for instance, TSVs or Cu—Cu connections, so that they behave as a single device to achieve performance improvements at reduced power and a smaller footprint than conventional two-dimensional devices.

In some embodiments, TSVs can be used, which makes the 3D ICs embodiments that are considered 3D SICs. Embodiments as 3D ICs or as 3D SICs can be created to be heterogeneous, e.g. combining different memory type layers and/or one or more processing layers into a single IC stack. Alternative embodiments of 3D SICs can include monolithic 3D ICs.

Embodiments using monolithic 3D ICs are created in layers on a single semiconductor wafer that is then diced into 3D ICs. These embodiments are advantageous in that there is no need for aligning, thinning, bonding, or TSVs. Although the disclosure herein is mostly focused on 3D SIC embodiments, it is to be understood that the embodiments disclosed herein are not limited to 3D SIC embodiments. Some embodiments can be a monolithic 3D IC instead of a 3D SIC. In such example embodiments, the overall structure of the 3D IC can be similar; however, the interconnects of a monolithic 3D IC includes fabricated vias instead of TSVs.

As for producing 3D SIC embodiments, such embodiments can be generated by a die-to-die, a die-to-wafer, or a wafer-to-wafer production method. In a die-to-die method, thinning and TSV creation may be done before or after bonding in the production method. An example advantage of die-to-die methods is that each component die can be tested before stacking it with other dies. Also, each die can be separately binned for production. In a die-to-wafer method, similar to a wafer-to-wafer method, thinning and TSV creation are performed either before or after bonding. But, an advantage of die-to-wafer over wafer-to-wafer is that additional dies may be added to a stack before dicing, and a die can be tested before adding it to a wafer. In wafer-to-wafer, each wafer may be thinned before or after bonding, and connections are either built into the wafers before bonding or else created in the stack after bonding. With wafer-to-wafer methods, the TSVs can pass through the silicon substrates between active layers and/or between an active layer and an external bond pad. A disadvantage of a wafer-to-wafer method is that a defect in one chip causes a defect in the entire stacked output of the method.

Chip scaling processes are slowly improving in-part because of power-density constraints and interconnects are not becoming faster while transistors are becoming faster in general. 3D ICs address both of these example scaling problems by stacking two-dimensional dies and connecting the dies in a third dimension. Such stacking can possibly make communications between chips faster, compared to a horizontal arrangement of ICs. Also, 3D ICs can provide other possible benefits over horizontally arranging chips, including: a smaller footprint, shorter interconnects, reduced power consumption, circuit security through obscurity, and increased bandwidth.

3D ICs provide greater functionality into a smaller two-dimensional space by taking advantage of adding functionality in layers of a third dimension, and costs can be saved by partitioning a large chip into multiple smaller dies with 3D stacking. To put it another way, the 3D IC manufacturing can be more modular than conventional processes of producing a chip with an array of ICs. Also, 3D ICs can be generated with layers that are created with different processes or different types of wafers, which increases design options. Also, increased connectivity expands design options.

Another advantage is that 3D ICs reduce power consumption by keeping a signal within the device. Shorter electrical connections in two different directions (e.g., horizontally and vertically) also reduce power consumption by producing less parasitic capacitance for example. Reducing the power budget also leads to less heat generation.

Also, 3D ICs can achieve security through obscurity because the stacked die structure complicates attempts to reverse engineer the overall circuitry. Also, sensitive or critical functions can be divided amongst layers of the 3D IC to further conceal such functions. Some embodiments can even have a layer or die dedicated to monitoring or security of the other layers. This is analogous to a firewall layer, where a separate die of the 3D IC provides a hardware firewall for dies to be monitored at runtime. This can be done to protect parts or the entire stack of chips against attacks.

The fundamental structural arrangement of 3D ICs increases bandwidth by allowing large numbers of vias between the dies or layers that in combination can provide much more bandwidth than a conventional bus. Additionally, a set of functional blocks of the 3D SIC can act like a group of separate computers that are networked or clustered. Different functional blocks can have different types of processing units. And, the different types of functional blocks can be complimentary. And, the more related a functional block is to another block the more beneficial it is to locate two functional blocks next to each other. For example, a first block can provide a first data processing operation and a neighboring second block can provide a second data processing operation in a common multiple operation data processing method. Such features can greatly reduce the load of a controller of computerized system. For instance, such features can reduce the load of a central processing unit (CPU).

In embodiments where the blocks are implemented by a 3D SIC, the use of TSVs can make it advantageous to reduce each functional block to one function so that the benefits of TSVs are fully realized. In such embodiments, the functionality of the 3D IC can be increased by increasing the number of functional blocks in the 3D IC and not the number of functions that a single functional block can perform. This way, the TSV or another type of interconnect of a 3D SIC can be used to its full potential.

A TSV is an electrical connection that can pass completely through a silicon wafer or die. With TSVs, interconnections and device density is substantially higher than with conventional interconnections between die. And, length of the connections between die is shorter than conventional interconnections.

Some embodiments can have TSVs added to the 3D IC structure via-first TSV fabrication. This is a process where the TSVs are fabricated before the components, e.g., transistors, capacitors, and resistors, are patterned onto the wafer. Some embodiments use via-middle TSV fabrication where TSVs are fabricated after the individual devices are patterned but before the metal layers are added to a die or a stack of dies. And, some embodiments use via-last TSV fabrication where TSVs are fabricated after or during the addition of metal layers.

In addition to the way in which TSVs are added to the 3D IC, the layout and design of the TSVs can vary between embodiments described herein. For example, differences in partitioning granularity of functional elements of the dies of the 3D IC can cause variation in the design and layout of TSVs. Some embodiments have gate level partitioning using TSVs and other embodiments have block level partitioning. Gate level partitioning using TSVs is less practical than block level partitioning; thus, to increase the benefit of having more TSVs, functional sub-elements partitioned within a functional block can be connected via TSVs in a first direction (e.g., vertically). This can be a middle ground solution.

In some embodiments, a stack of chips or die can have a processing logic integrated circuit (IC), memory ICs, such as 3D XPoint memory (3DXP) and dynamic random access memory (DRAM) ICs, as well as thermal sensing and management layers and respective components in such layers. Units of processing logic, 3DXP, DRAM, and thermal sensing and management can be connected, in a first direction (e.g., vertically), to form a functional block, such as by TSVs and/or interconnects. Different functional blocks can be configured differently on demand and/or operate substantially independently from each other in one 3D SIC or, in general, in one 3D IC. The processing logic implements frequently used functions and/or data intensive functions, such that even though the processing logic IC may not have the processing power of a CPU, its advantage in better data access can provide a better overall performance in implementing selected functions. Multiple functional blocks (e.g., multiple column functional blocks within a 3D SIC or 3D IC) can run in parallel and reduce the computation load on the CPU.

As mentioned, in some embodiments, the processing logic IC or die does not have a full array of processing cores that a typical CPU would have. But, in such embodiments, the processing logic implements frequently used functions and/or data intensive functions; thus, having potential to relieve the CPU of significant processing duties and enhancing the performance of the CPU. In such embodiments, a functional block cannot execute a complete set of multi-functional instructions on its own. Therefore, the functional block and the remainder of the 3D IC can be connected to a CPU, and the CPU may instruct the function block to do a task it is configured to do. For example, a functional block of example embodiments can be configured to decrypt, by its processing logic IC, the data stored in its non-volatile memory IC, and insert the decrypted data into its volatile memory to be communicated to the CPU for further processing by CPU. Also, the CPU can provide a request to the volatile memory of a functional block to request the block to generate a result of a certain function, and the CPU can also provide a follow-up request to retrieve the result from the functional block. For instance, the request for generation of the result can be provided from the CPU to the functional block in the form of a write command, and the request to retrieve the result can be provided from the CPU to the functional block in the form of a read command.

With all that said, the dense integration of ICs through stacking can lead to overheating. To overcome problem of overheating, one or more thermal management components can be added somewhere between the stacked chips to promote heat dissipation. Further, one or more thermal management components or heat sinks can be added above or below the stacked chips to promote heat dissipation.

As examples, a thermal management component can be implemented as a metal layer (e.g., copper or aluminum) deposited on the back of a die (e.g., logic processing die, DRAM die, 3DXP die) or both sides of a die specifically designed for thermal management, or as an active cooling component (e.g., Peltier plate). The metal layer can be thicker than metal layers used to form integrated circuits in logic processing die, DRAM die, and/or 3DXP die. A portion of the metal layer can be used to provide interconnections for the IC circuits (e.g., inter-block communication paths). Material of high heat conductivity but not conductive in electricity can be used to bridge the gaps in interconnects and the remaining parts of the metal layer. The boundary portion of the metal layer can be connected via pins or fins to the outside of the IC package for heat dissipation (e.g., for cooling using external cooling elements, such as fans, heat sinks, heat pipes, etc.).

Also, temperature sensors can be used to determine temperature distribution in different areas of the stacked chips. The temperature sensors can be implemented between the die such as between the processing logic die and a memory die. Also, the temperature sensors can be implemented between memory die. Based on the temperature distribution, a device can regulate the computation activities of the functional blocks of the 3D IC (e.g., see methods 700 and 800 of FIGS. 10 and 11). For example, processing logic partitions on the processing logic die, in hot areas, can run at a reduced clock and/or can be temperately placed in a sleep mode. Also, for example, neighboring blocks in a hot area can become active in a round-robin fashion in consuming power; and thus, reduce the power inputted to the hot area and consequently the temperature in the hot area.

Further, temperature sensors and/or temperature sensing circuits can be formed on some of the dies in the stack (e.g., logic processing die, DRAM die, 3DXP die, or another die specifically designed for thermal management). In a direction, in a plane parallel to the dies, temperature sensors can be positioned at locations that are likely to become hot spots in operation.

FIG. 1 illustrates a front view of a 3D SIC 100 having a non-volatile memory die 102, a volatile memory die 108, a processing logic die 106, and a thermal management component 130 (e.g., heat spreader with high metal density) in accordance with some embodiments of the present disclosure. The thermal management component 130 as well as any other of the disclosed thermal management components (such as heat spreader 131 of FIG. 7, which includes silicon and high metal density) can be configured to conduct heat more efficiently than the dies of the 3D SIC. Although one thermal component per 3D SIC is shown in the drawings, multiple thermal management components can be added somewhere between the stacked dies of a single 3D SIC to promote heat dissipation. Further, one or more thermal management components or heat sinks can be added above or below the stacked dies to promote heat dissipation.

As shown, the dies and the thermal component are parallel to each other. The 3D SIC 100 also has functional blocks 110, 112, and 114 (as shown in FIG. 1) as well as functional blocks 210, 212, 214, 220, 222, and 224 (as shown in FIGS. 2-5) that traverse and are perpendicular to the non-volatile memory die 102, the volatile memory die 108, the processing logic die 106, and the thermal management component 130. The 3D SIC 100 also has TSVs 120, TSVs 132, and TSVs 134 that connect the dies and the thermal management component respectively. TSVs 134 are shown in between and connecting the non-volatile memory die 102 to the thermal management component 130. TSVs 132 are shown in between and connecting the thermal management component 130 to the processing logic die 106. TSVs 120 are shown in between and connecting the processing logic die 106 to the volatile memory die 108. It is to be understood that all the TSVs described herein pass through the dies described herein even thought this may not be clear from the drawings. For example, TSVs 120 and 132 are part of single TSVs passing through the processing logic die 106.

The 3D SIC 100 also has interconnects 122, 126, and 128, which are shown as embedded in the dies respectively. Interconnects 122 are shown embedded in the non-volatile memory dies 102. Interconnects 126 are shown embedded in the processing logic die 106. And, interconnects 128 are shown embedded in the volatile memory die 108. The interconnects 122, 126, and 128 can be perpendicular to the TSVs 134, 132, and 120 (as shown in FIG. 1 and as shown partially in FIG. 7).

It is to be understood that interconnects described herein, such as interconnects 122, 126, and 128, refer to interconnections between components of a chip or die (e.g., copper or metal interconnects, interconnect traces, etc.). The interconnects can include interconnects in the metallization layer of a die or chip.

The FIG. 1 also shows the 3D SIC 100 having electrical temperature sensors 136a, 136b, 136c, 138a, 138b, and 138c. The electrical temperature sensors 136a, 136b, 136c, 138a, 138b, and 138c are shown connecting the dies and the thermal management component respectively. Specifically, electrical temperature sensors 138a, 138b, and 138c are shown in between and connecting the non-volatile memory die 102 to the thermal management component 130. The electrical temperature sensors 136a, 136b, and 136c are shown in between and connecting the thermal management component 130 to the processing logic die 106.

The FIG. 1 also shows the 3D SIC 100 having electrical temperature sensor arrays 140 and 142. The sensor array 140 includes the TSVs 132 and the electrical temperature sensors 136a, 136b, and 136c. The sensor array 142 includes the TSVs 134 and the electrical temperature sensors 138a, 138b, and 138c. In some embodiments, the 3D SIC only has one electrical temperature sensor array, or have more than two electrical temperature sensor arrays. For example, an electrical temperature sensor array can be position at each die of the 3D SIC as well as at the thermal management component. Also, an electrical temperature sensor located at any one of the aforesaid locations (such as located between the thermal management component and the processing logic die) can be used to measure a temperature of either a part of one of the dies, a part of the thermal management component, or a heat exchange medium in between one of the parts of the 3D IC. For example, a sensor can be used to measure a temperature of either a part of the processing logic die, a part of the thermal management component, or a heat exchange medium in between the thermal management component and the processing logic die. Also, any one of the sensors described herein can communicate the measured temperature to one of the memory dies so that the measured temperature can be used to control the use of functional blocks of the 3D SIC.

In some embodiments, a 3D SIC can have multiple non-volatile memory dies (not depicted). In some embodiments, the non-volatile memory dies are slower than the volatile memory dies. Specifically, the non-volatile memory dies have less bandwidth (e.g., the maximum amount of data the die can transfer each second) than the volatile memory dies. The non-volatile memory dies can include 3DXP dies or any other type of electrically addressed memory system die, e.g., a EPROM die, flash memory die, ferroelectric RAM, and magnetoresistive RAM. Each non-volatile memory die can have an array of non-volatile memory partitions. Each partition of the array of non-volatile memory partitions can include an array of non-volatile memory cells and each cell can have a corresponding address.

Figure 2:
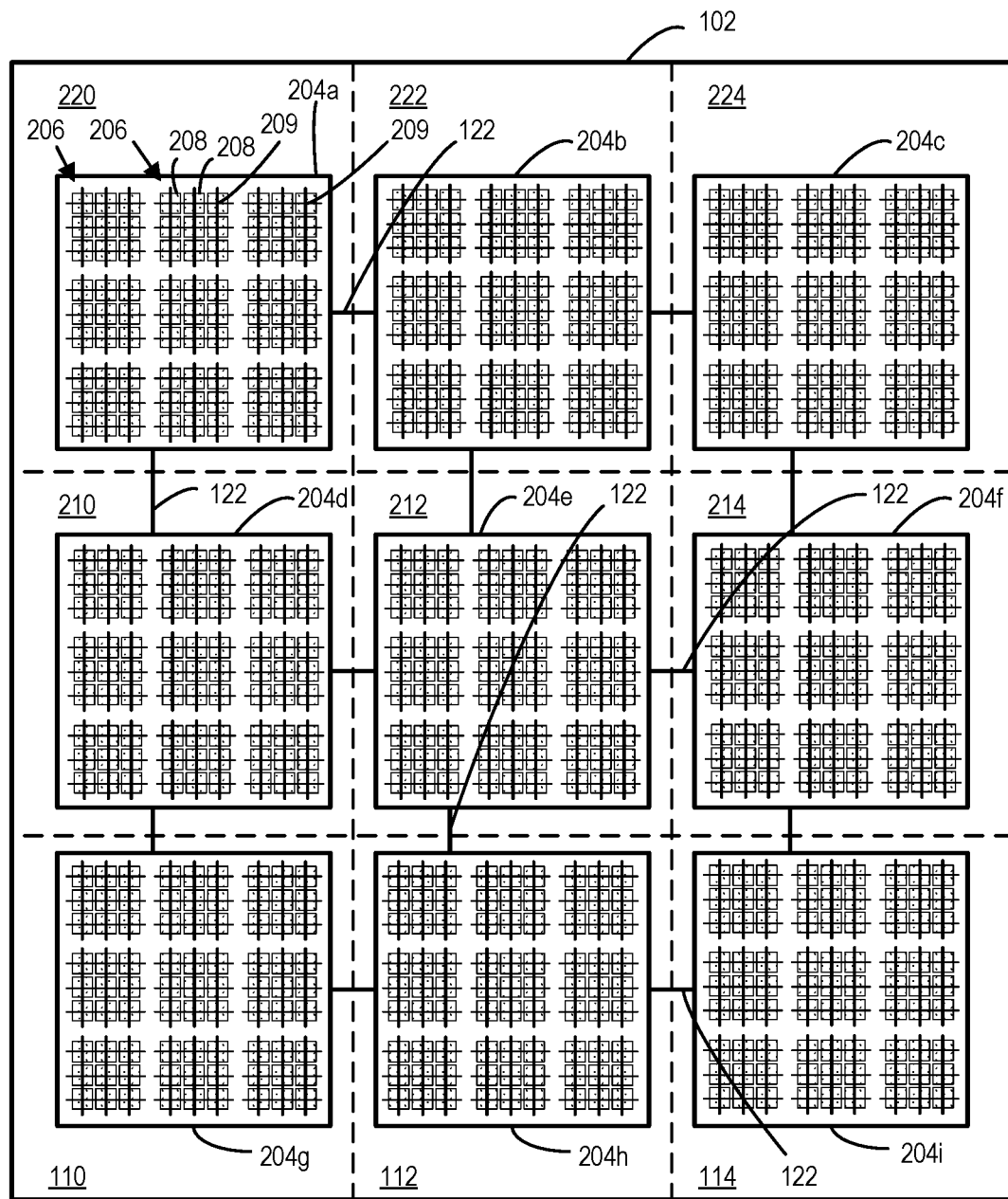
FIG. 2 illustrates a top view of an example non-volatile memory die having multiple non-volatile memory partitions (each partition having multiple non-volatile memory elements) in accordance with some embodiments of the present disclosure.

FIG. 2 illustrates a top view of the non-volatile memory die 102 having multiple non-volatile memory partitions 204a, 204b, 204c, 204d, 204e, 204f, 204g, 204h, and 204i in accordance with some embodiments of the present disclosure. The partitions can be arranged in a second direction (i.e., perpendicular to the first direction of the stacking of the dies of the 3D IC). Each of the partitions 204a, 204b, 204c, 204d, 204e, 204f, 204g, 204h, and 204i has multiple non-volatile memory elements. Each of the partitions illustrated in FIG. 2 shows nine non-volatile memory element clusters 206. And, each of the non-volatile memory element clusters 206 shows nine non-volatile memory elements 208. Thus, each of the partitions illustrated in FIG. 2 has eighty-one memory elements 208. However, it is to be understood that the depiction of eighty-one memory elements is for convenience sake and that in some embodiments each partition could have up to at least a billion memory elements. To put it another way, the number of memory elements per non-volatile memory partition can be enormous and vary greatly. Also, it is to be understood that non-volatile memory die 102 and non-volatile memory die 104 can be somewhat similar or exactly the same with respect to structure and design.

A 3DXP IC (also known as a 3D XPoint memory IC) uses transistor-less memory elements, each of which has a memory cell and a corresponding address (as well as an optional selector and the cell and optional selector can be stacked together as a column). In examples with memory elements, the memory elements can be connected via two perpendicular layers of interconnects (as shown but not labeled in FIG. 2), where one layer is above the memory elements and the other layer is below the memory elements. Each memory element can be individually selected at a cross point of one interconnect on each of the two layers of interconnects (e.g., see cross point 209 shown in FIG. 2). Each cross point has an address or is addressable or selectable such as by an address decoder of the 3DXP IC, the 3D IC, or a group of ICs of the 3D IC. 3DXP devices are fast and non-volatile and can be used as a unified memory pool for processing and storage.

As mentioned, the non-volatile memory dies 102 and 104 can be 3DXP dies. Some advantages of using a 3DXP die as the non-volatile memory die of the 3D SIC 100 include that it is bit addressable by an address decoder. An address decoder (not shown in the drawings) used with an embodiment described herein can be a binary decoder that has two or more inputs for address bits and one or more outputs for device selection signals. When the address for a particular device or IC appears on the address inputs, the decoder asserts the selection output for that device or IC. A dedicated, single-output address decoder can be incorporated into each device or IC on an address bus, or a single address decoder can serve multiple devices or ICs.

Also, the 3D SIC can have a volatile memory die (such as a DRAM die or a static random access memory (SRAM) die) including an array of volatile memory partitions. Each partition of the array of volatile memory partitions can include an array of volatile memory cells and each cell can have a corresponding address.

Figure 3:
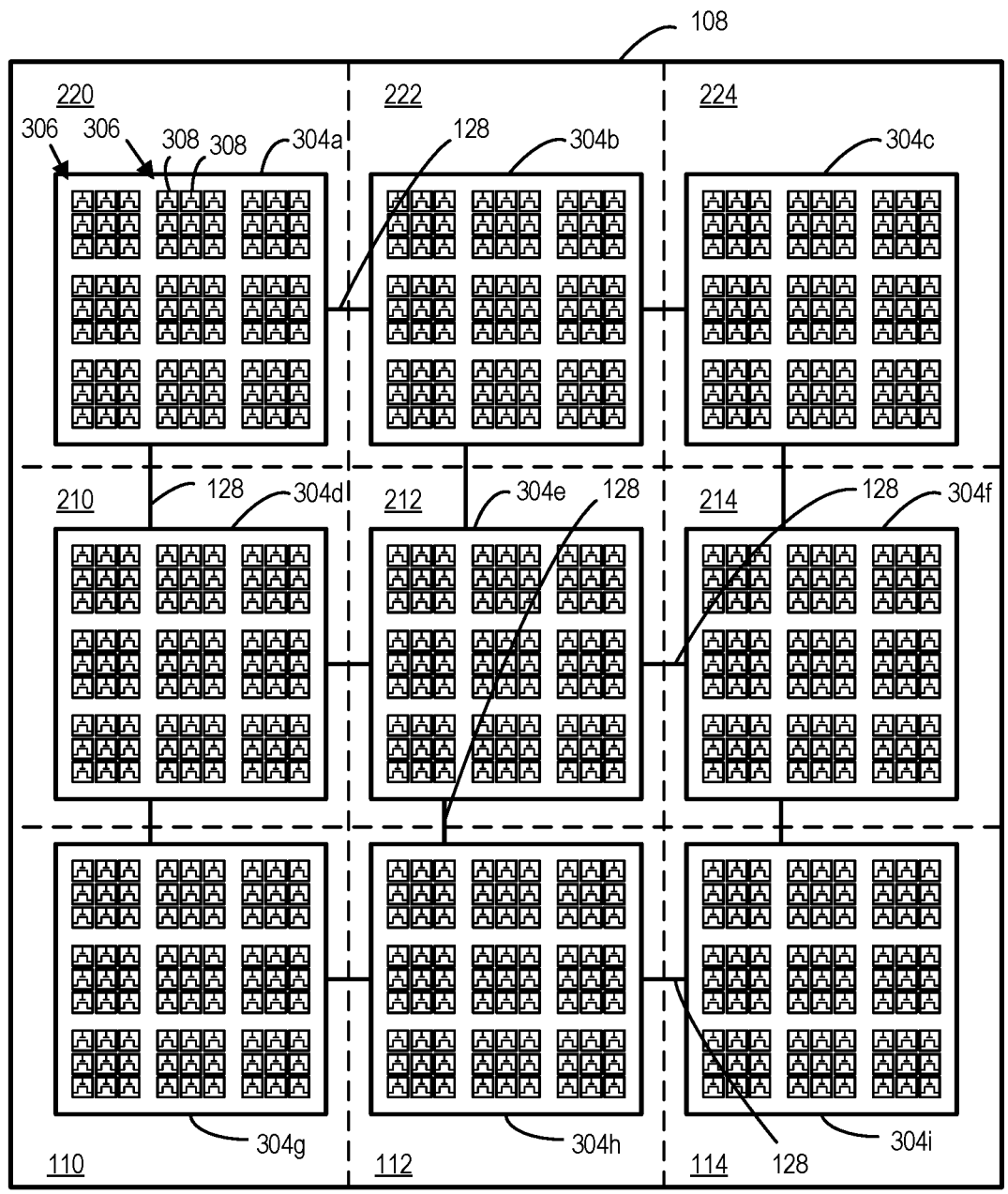
FIG. 3 illustrates a top view of an example volatile memory die having multiple volatile memory partitions (each partition having multiple volatile memory elements) in accordance with some embodiments of the present disclosure.

FIG. 3 illustrates a top view of the volatile memory die 108 having multiple volatile memory partitions 304a, 304b, 304c, 304d, 304e, 304f, 304g, 304h, and 304i in accordance with some embodiments of the present disclosure. The partitions can be arranged in a second direction (i.e., perpendicular to the first direction of the stacking of the dies of the 3D IC). Each of the partitions 304a, 304b, 304c, 304d, 304e, 304f, 304g, 304h, and 304i has multiple volatile memory elements. Each of the partitions illustrated in FIG. 3 shows nine volatile memory element clusters 306. And, each of the volatile memory element clusters 306 shows nine volatile memory elements 308. Thus, each of the partitions illustrated in FIG. 3 has eighty-one memory elements 308. However, it is to be understood that the depiction of eighty-one memory elements is for convenience sake and that in some embodiments each partition could have up to at least a billion memory elements. To put it another way, the number of memory elements per volatile memory partition can be enormous and vary greatly.

The 3D SIC can also have a processing logic die having an array of processing logic partitions. Each partition can have a separate field-programmable gate array (FPGA) or another type of processing logic device. The processing logic die can include a controller unit and an arithmetic/logic unit. For instance, the arithmetic/logic unit can include an FPGA.

Figure 4:
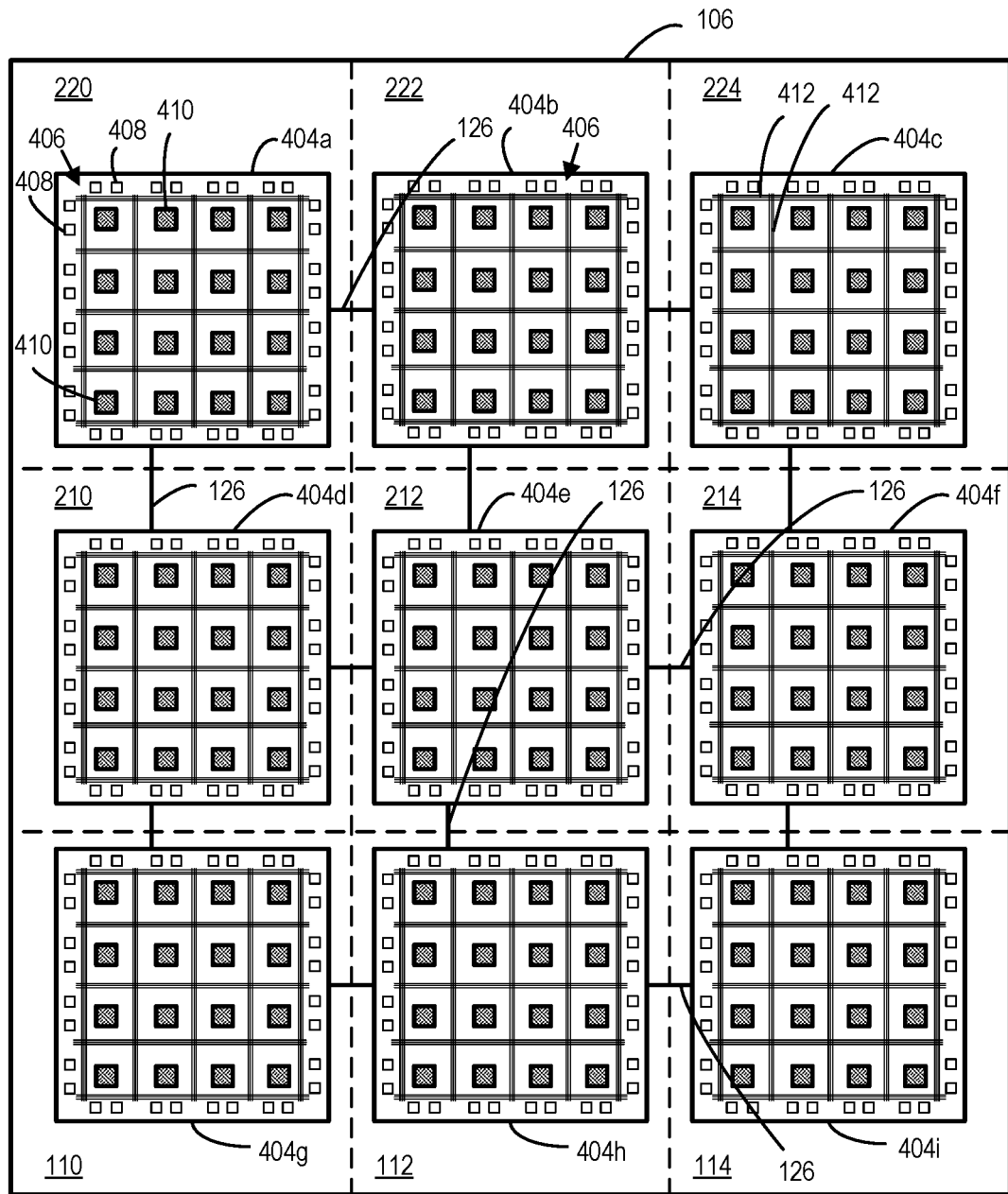
FIG. 4 illustrates a top view of an example processing logic die having multiple processing logic partitions (each partition having a separate field-programmable gate array) in accordance with some embodiments of the present disclosure.

FIG. 4 illustrates a top view of the processing logic die 106 having multiple processing logic partitions 404a, 404b, 404c, 404d, 404e, 404f, 404g, 404h, and 404i in accordance with some embodiments of the present disclosure. FIG. 4 shows each of the partitions 404a, 404b, 404c, 404d, 404e, 404f, 404g, 404h, and 404i having a separate FPGA 406. As shown, each of the nine FPGAs 406 illustrated in FIG. 4 has thirty-two input/output blocks 408 and sixteen logic blocks 410. Also, FIG. 4 shows programmable or non-programmable interconnects 412 between the input/output blocks 408 and the logic blocks 410 of each of the nine FPGAs 406. It is to be understood that the depiction of the amount of input/output units and logic units of an FPGA 406 is for convenience sake and that in some embodiments each FPGA of a partition could have more or less input/output units and logic units depending on the embodiment of the corresponding functional block. Also, even though FIG. 4 shows one FPGA per partition, it is to be understood that each processing logic partition can have multiple FPGAs in other embodiments of the 3D SIC or the processing logic die. To put it another way, the number of specific parts of the processing logic die can vary greatly.

Figure 5:
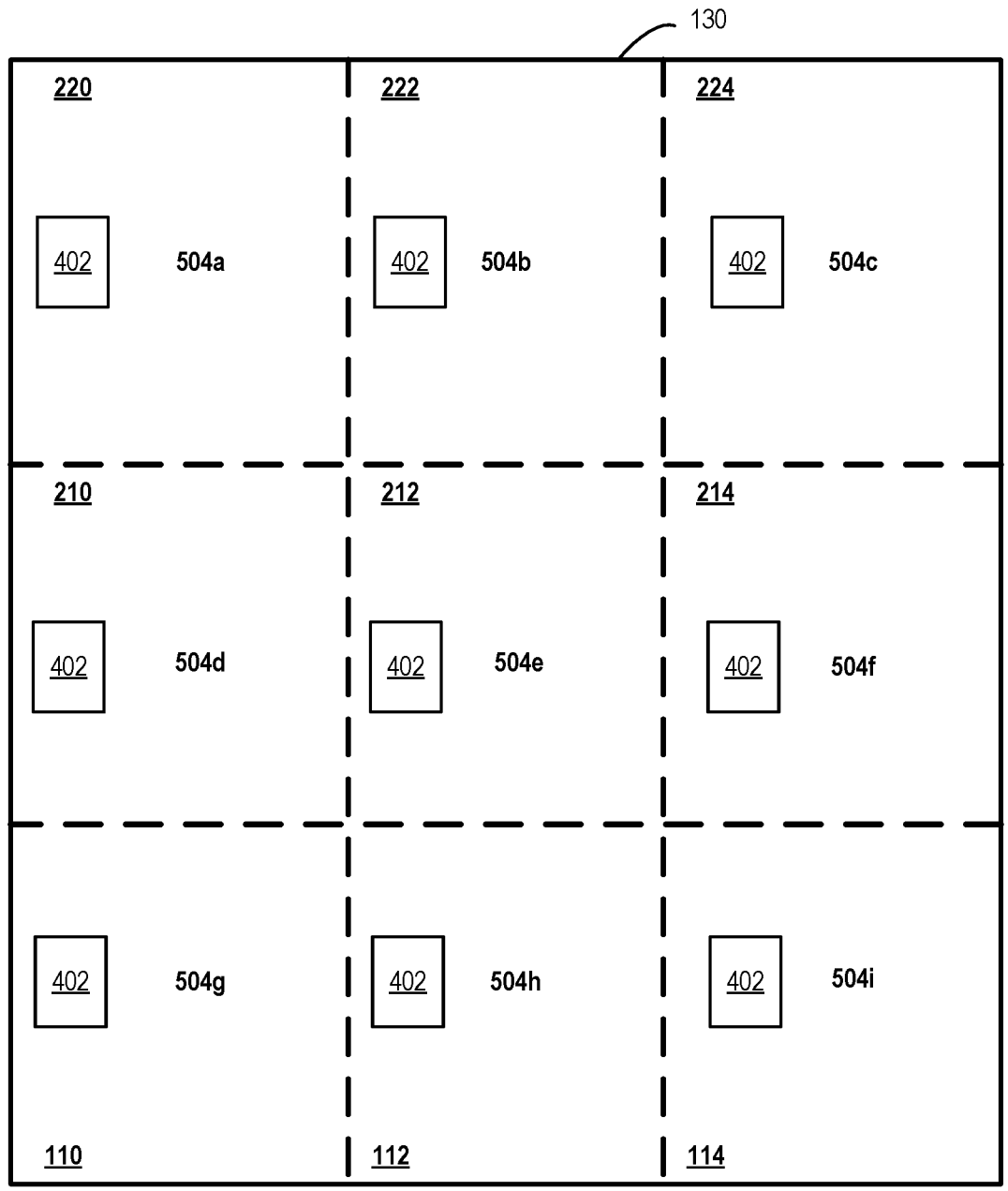
FIG. 5 illustrates a top view an example thermal management component having multiple thermal management partitions in accordance with some embodiments of the present disclosure.

FIG. 5 illustrates a top view of the thermal management component 130 having multiple thermal management partitions 504a, 504b, 504c, 504d, 504e, 504f, 504g, 504h, and 504i in accordance with some embodiments of the present disclosure. FIG. 5 shows each of the partitions 504a, 504b, 504c, 504d, 504e, 504f, 504g, 504h, and 504i having respective separate openings 402 for interconnects. Each opening of the multiple openings 402 can be or include one or more TSVs that interconnect the processing logic die 106 and the non-volatile memory die 102 (e.g., see the combination of FIGS. 1 and 5). Also, similar interconnects can interconnect the processing logic die 106 and the volatile memory die 108 (e.g., as taught by the combination of FIGS. 1 and 8). And, each interconnect of the multiple interconnects run through the thermal management component to make such connections between the dies. The interconnects can also be or include metal interconnects that run through the thermal management component 130 and connect respective TSVs of the plurality of TSVs on opposing sides of the thermal management component shown in FIGS. 1 and 7.

Figure 7:
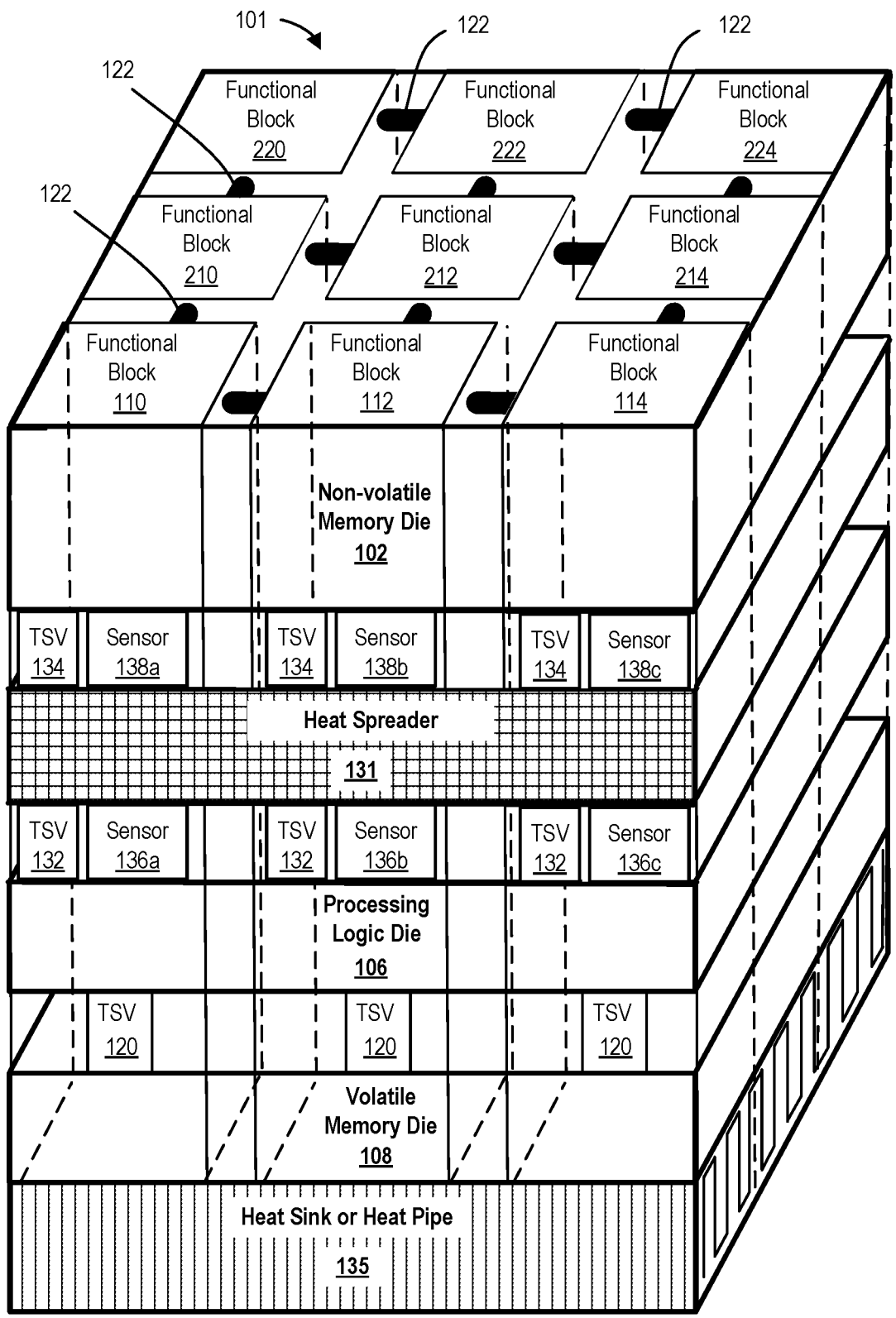
FIG. 7 illustrates a perspective view of another example 3D SIC having a non-volatile memory die, a volatile memory die, a processing logic die, a heat spreader, and a heat sink in accordance with some embodiments of the present disclosure.

As shown, each of the multiple thermal management partitions 504a, 504b, 504c, 504d, 504e, 504f, 504g, 504h, and 504i lack illustration beyond respective interconnect openings 402. The lack of illustration is because there is a great number of different implementations of the thermal management component 130 and its multiple thermal management partitions 504a, 504b, 504c, 504d, 504e, 504f, 504g, 504h, and 504i. One general example of the very many examples of the implementations of the thermal management component 130 is shown in FIG. 7. In FIG. 7, the thermal management component is implemented as heat spreader 131. Thus, if FIG. 5 illustrated a top view of heat spreader 131, it would show each one of thermal management partitions 504a, 504b, 504c, 504d, 504e, 504f, 504g, 504h, and 504i having a respective opening of openings 402 and a corresponding section of the heat spreader 131. The heat spreader 131 includes silicon, which allows the TSV to pass through the heat spreader 131. The heat spreader 131 also includes high metal density within the spreader to provide heat conductivity.

In some embodiments, the thermal management component (such as thermal management component 130) has more metal content then the other layers of the 3D IC (such as 3D SIC 100). Although, the dies can have some metal. Thus, the thermal management component could be more heat conductive just by having a greater metal content then the dies. In one example embodiment, the thermal management component could be a dummy die with a majority of metal content, such as by having a metal layer. In one embodiment, the thermal management component can be simply formed on the back of one of the dies. Where a metal layer is used by the thermal management component, for improved heat conductivity, the thickness of the metal layer can be increased to be thicker than used in dies for memory or processing logic. Also, a part of the metal layer of the thermal management component can be patterned as interconnects that can serve as bus or interconnection for the memory or processing logic dies. Some TSVs can be connected to the interconnects in the metal layer. Alternatively, TSVs can be isolated from the metal layer (such as through holes in the metal layer). Multiple layers of metals can be placed between the dies of memory and processing logic, and a metal layer can also be added to the bottom or the top of the 3D SIC.

In some embodiments, the thermal management component can be or includes a heat spreader (as shown in FIG. 7), a heat sink (as shown in FIG. 7), a heat pipe, or any combination thereof. The 3D SIC could also include a Peltier cooling plate on the top or bottom of the stack of dies. The thermal management component is configured to remove excess heat from one or more of the dies of the 3D SIC 100. As shown in the drawings, the thermal management component 130 and heat spreader 131 are stacked next to the processing logic die 106 to remove excess heat from the processing logic die. Also, by its placement, the thermal management component 130 and heat spreader 131 can remove excess heat from one or more of the memory dies of the 3D SIC 100. Thus, the thermal management component 130 can improve reliability and prevent premature failure by removing excess heat. Another way of reducing heat amongst the dies is to reduce the power input to the dies since heat output corresponds to power input. Management of power input of the 3D SIC 100 is described in detail herein in the description of respective methods 700 and 800 of FIGS. 10 and 11.

Figure 9:
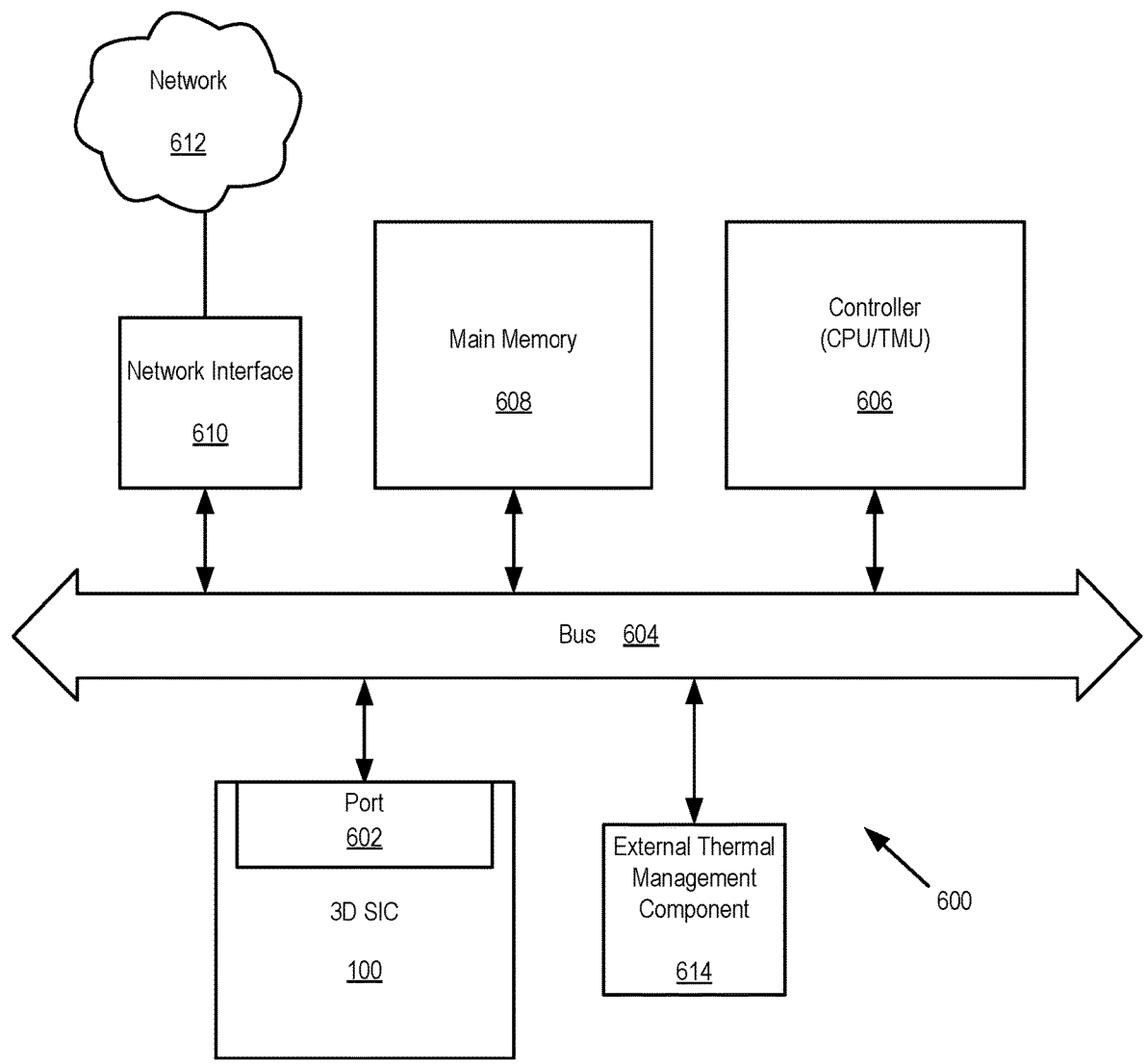
FIG. 9 illustrates a block diagram of an example computer system in which embodiments of the present disclosure can operate.

As mentioned, there are several possible techniques for cooling the 3D SIC 100 including various types of heat sinks, thermoelectric coolers, forced air systems and fans, heat pipes, and any combination of such types of thermal management components, which can be implemented by the thermal management component 130 or a combination of the thermal management component 130 and a thermal management device external to the 3D SIC 100 (e.g., such as a thermal management component on top of the 3D IC, below the 3D IC, or next to the 3D IC—see external thermal management component 614 illustrated in FIG. 9). Also, embodiments of the thermal management component 130 can be or includes features for adding heat to or conserving heat generated by the 3D SIC 100 or any one or more of its dies. Such heat adding or preserving embodiments can be useful when the 3D SIC 100 is configured to operate in extreme low environmental temperatures. For example, the thermal interface materials may have different thermal conductivity values than other materials used in other dies. In some examples, a thermal interface material has a higher thermal conductivity than a memory die; in other cases, the thermal interface material has a lower thermal conductivity.

In some embodiments of the 3D IC, thermal interface materials can be used to fill the gaps between thermal transfer surfaces of the thermal management component and a neighboring die to increase thermal transfer efficiency. The thermal interface materials can have a higher thermal conductivity in the direction of the stacked dies than the direction of the layouts of the dies; and thus, the thermal interface materials can either be more efficient at either removing or adding heat to the dies, depending on the embodiment of the 3D IC.

The thermal management component can be or include various types of heat sinks, such as heat sinks that include a metal object brought into contact with an electronic component's hot surface or the combination of including a thin thermal interface material that mediates between the surfaces of the electronic component's hot surface and the metal object of the sink. The metal object of the heat sink can include one or more metal structures with one or more flat surfaces to provide sufficient thermal contact with the die or other components to be cooled, and an array of comb or fin like protrusions from the flat surface(s) to increase the surface contact with the heat exchange medium between the spaces in the array of comb or fin like protrusions.

The heat exchange medium existing between the spaces is provided to carry the excess heat away from the die of the 3D IC. Thus, when air or another gas is used as a moving heat exchange medium, the heat sink can be used in conjunction with a fan to increase the rate of flow of the heat exchange medium over the heat sink. For example, the external thermal management component 614 illustrated in FIG. 6 can be or include such a fan. Such a combination, wherein the heat exchange medium is air, is referred to as a forced air system since it maintains a larger temperature gradient by replacing warmed air faster than convection. Also, in most embodiments, the 3D IC (e.g., the 3D SIC 100) will be housed and sealed from external elements such as air and the moisture in the air. Thus, a forced air system is usually used with a thermal management component that is located on top of the 3D IC or at least located outside of the housing of the 3D IC.

A 3D IC can also include a cooling plate on the top or bottom of the stack of dies, or even in the stack between two dies. In some examples, such plates can act as a heat transfer interface between the heat source and a colder heat exchange medium. An advantage of using a cooling plate over a heat sink is that it can be thinner than a sink and thus its use can reduce the overall height of the 3D IC compared to the use of a heat sink. The thermal management component can be a cooling plate or a cooling plate can be used in addition to the thermal management component, such as being place above or below the 3D IC.

The thermal management component of the 3D IC can be made up of or at least include on at least part of its surfaces an efficient thermal conductor such as silver, gold, copper, aluminum alloy, or a combination thereof. In some embodiments, to take advantage of the beneficial tradeoffs of the aforesaid alloys, the heat sink can have outer regions made up of aluminum alloy, and one of the costlier alloys, e.g., silver, gold, copper alloys, can be the core of the heat sink. In some embodiments, thermally conductive grease is used to ensure optimal thermal contact. Such embodiments of the heat sink can include colloidal silver.

It is to be understood that in embodiments with the heat sink, it is preferred that the heat sink is above and/or below the dies of the 3D SIC.

In some embodiments, a heat sink (such as heat sink or heat pipe 135 illustrated in FIG. 7) includes a plurality of thermally conductive fins that include an electrical insulator material. In some other embodiments, the heat sink includes a plurality of thermally conductive fins including copper, aluminum, or another thermally conductive metal, and wherein the couplings passing through the heat sink are insulated independently.

In some embodiments of the 3D IC, the thermal management component or an additional thermal management component can be position on top of the stack of dies of the 3D IC to take advantage of convective air cooling. Some embodiments can have the thermal management component or an additional thermal management component to the side of the stack of dies of the 3D IC. Also, some embodiments can include a combination of the aforesaid side arrangement of a thermal management component and the aforementioned top arrangement of a thermal management component.

The 3D SIC can include various types of Peltier cooling plates that use the Peltier effect to create a heat flux between the junction of two different conductors of electricity by applying an electric current. The 3D SIC could include a Peltier cooling plate on the top or bottom of the stack of dies. Peltier cooling plates can be effective cooling parts because they are active cooling components in that an electrical force is used to move the heat away from the cooled die of the 3D IC. Multiple separate Peltier plates can be arranged along a plane of the 3D IC orthogonal to the direction of the stacking of the dies. For example, each functional block can include or be associated with a respective Peltier cooling plate or groups of the blocks can each have or be associated with a respective Peltier cooling plate; however, this is only the case where such plates are used at the top or the bottom of the 3D IC. It is to be understood that Peltier cooling plates are either part of the 3D IC on an outside part of the 3D IC or are entirely external to the 3D IC.

An example advantage of the Peltier plate is that its effectiveness as a thermal conductor can be controlled. For example, in some embodiments, such as the 3D SIC 100, a controller can selectively control an array of Peltier plates to selectively cool functional blocks of the 3D IC on a block-by-block basis. Thus, possibly limiting the power consumption of an array of Peltier plates. In general, selectively controlling, by a controller (such as the controller 606 illustrated in FIG. 6), partitions of the thermal management component can be used alternatively or in addition to the controlling of the respective power input to the individual functional blocks of the 3D IC (e.g., see detailed description of methods 700 and 800). Also, because of the active nature of Peltier plates, such plates can be useful in embodiments of the 3D IC configure for use in changing environments where temperature extremes exist.

The 3D IC can be cooled using an electrostatic heat exchange medium accelerator (EFA) which pumps a heat exchange medium such as air without any moving mechanical parts like the rotating blades of a fan. An EFA uses an electric field to propel electrically charged air molecules, and such a field can be provided by multiple interconnects. Because air molecules are normally neutrally charged, the EFA has to create some charged molecules, or ions, first. There are three general steps in the heat exchange medium acceleration process: ionize air molecules, use those ions to push many more neutral molecules in a desired direction, and then recapture and neutralize the ions to eliminate any net charge.

The thermal management component can also be or include synthetic diamond cooling sinks. Also, the thermal management component can also be or include a heat sink constructed of multiple phase change materials that can store a great deal of energy due to heat of fusion. In some embodiments, the 3D SIC can include a thermal ground plane (TGP). And, the TGP can be combined with a heat sink to form a compact heat transfer assembly such as for use in extreme thermal environments.

Figure 6:
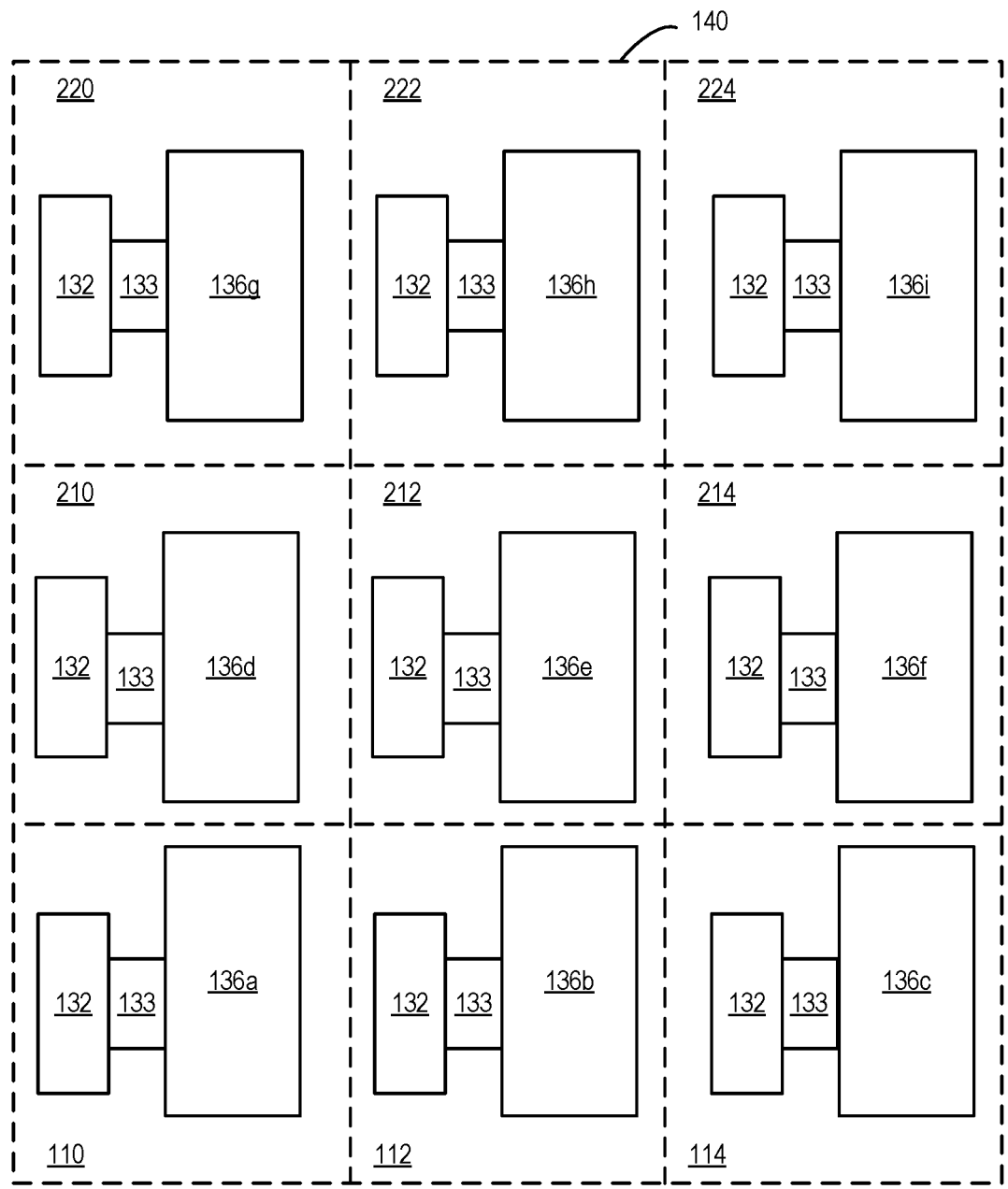
FIG. 6 illustrates a top view of an example array of electrical temperature sensors in accordance with some embodiments of the present disclosure.

FIG. 6 illustrates a top view of the array of electrical temperature sensors 140 having multiple electrical temperature sensors 136a, 136b, 136c, 136d, 136e, 136f, 136g, 136h, and 136i in accordance with some embodiments of the present disclosure. FIG. 6 shows each of the sensors 136a, 136b, 136c, 136d, 136e, 136f, 136g, 136h, and 136i connecting to TSVs 132 via interconnects 133. Each column of the 3D SIC 100 (i.e., each block of functional blocks 110, 112, 114, 210, 212, 214, 220, 222, and 224) includes a respective electrical temperature sensor of the array of electrical temperature sensors 140, and the respective electrical temperature sensor is stacked, in a first direction (e.g., vertically), in between the respective thermal management partition and the respective processing logic partition (not shown in FIG. 6). Also, it is to be understood that sensor array 140 and sensor array 142 can be somewhat similar or exactly the same with respect to structure and design.

The electrical temperature sensors described herein can include thermistors, silicon bandgap temperature sensors, and any other type of electrical temperature sensor applicable to temperature measurement of ICs. A respective electrical temperature sensor of the array of sensors 140 or 142 as well as any electrical temperature sensor described herein can be used to measure a respective temperature of the respective processing logic partition, the respective thermal management partition, or a heat exchange medium in between the respective thermal management partition and the respective processing logic partition. Also, such a sensor can communicate the measured respective temperature to the respective memory partition of one of the memory dies.

FIGS. 2, 3, 4, 5, and 6 also show the functional blocks 110, 112, 114, 210, 212, 214, 220, 222, and 224 of the 3D SIC 100. FIG. 2 shows a top view of respective sections of the functional blocks at the non-volatile memory die 102. FIG. 3 shows a top view of respective sections of the functional blocks at the volatile memory die 108. FIG. 4 shows a top view of respective sections of the functional blocks at the processing logic die 106. FIG. 5 shows a top view of respective sections of the functional blocks at the thermal management component 130. FIG. 6 shows a top view of respective sections of the functional blocks at the sensor array 140.

FIGS. 2, 3, and 4 also show the interconnects 122, 128, and 126 interconnecting the non-volatile memory partitions, the volatile memory partitions, and the processing logic partitions respectively. Thus, the interconnects 122, 128, and 126 are also shown interconnecting the functional blocks of the 3D SIC 100 at each layer of the 3D SIC. Specifically, as shown in FIG. 2, the interconnects 122 interconnect the non-volatile memory partitions 204a, 204b, 204c, 204d, 204e, 204f, 204g, 204h, and 204i of the non-volatile memory die 102. As shown in FIG. 3, the interconnects 128 interconnect the volatile memory partitions 304a, 304b, 304c, 304d, 304e, 304f, 304g, 304h, and 304i of the volatile memory die 108. And, as shown in FIG. 4, the interconnects 126 interconnect the processing logic partitions 404a, 404b, 404c, 404d, 404e, 404f, 404g, 404h, and 404i of the processing logic die 106.

In the 3D SIC, the non-volatile memory die, the volatile memory die, the processing logic die, the thermal management component, and the sensor array are arranged or stacked, in a first direction (e.g., vertically), and the processing logic die can be stacked in between the non-volatile memory die and the volatile memory die. The thermal management component can be stacked in between the non-volatile memory die and the processing logic die and/or stacked in between the volatile memory die and the processing logic die. The sensor array can be located in between the thermal management component and the processing logic die. The sensor array or an additional sensor array can also be stacked or positioned, in the first direction, in between the thermal management component and the non-volatile memory die or the volatile memory die.

The 3D SIC can also have an array of functional blocks which are made up from the dies, the thermal management component, and the sensor array of the 3D SIC. To put it another way, the non-volatile memory die, the volatile memory die, the processing logic die, the thermal management component, and the sensor array are arranged to form the array of functional blocks. At least two functional blocks of the array of functional blocks each can include a different data processing function that reduces the computation load of a controller—such reducing the computational load of a CPU. Each functional block of the array of functional blocks can include a respective column of the 3D SIC. A respective column of the 3D SIC can include a respective non-volatile memory partition of the array of non-volatile memory partitions, a respective volatile memory partition of the array of volatile memory partitions, a respective processing logic partition of the array of processing logic partitions, a respective thermal management partition of the array of thermal management partitions, and a respective sensor of the array of electrical temperature sensors. A respective processing logic partition can be stacked, in a first direction (e.g., vertically), in between a respective non-volatile memory partition and a respective volatile memory partition. A respective thermal management partition can be stacked in the first direction in between the respective non-volatile memory partition and the respective processing logic partition and/or stacked in the first direction in between the respective volatile memory partition and the respective processing logic partition. A respective sensor can be stacked or positioned in the first direction in between the respective thermal management partition and the respective processing logic partition. A respective sensor can also be stacked or positioned in the first direction in between a respective thermal management partition and a respective non-volatile memory partition or a respective volatile memory partition.

FIG. 7 illustrates a perspective view of 3D SIC 101 having a non-volatile memory die, a volatile memory die 108, a processing logic die 106, a heat spreader 131, and a heat sink or heat pipe 135, in accordance with some embodiments of the present disclosure. 3D SIC 101 is somewhat similar to 3D SIC 100 of FIG. 1, but its thermal management component is specifically a heat spreader 131. FIG. 7 shows perspective views of the non-volatile memory die 102, the volatile memory die 108, the processing logic die 106, the heat spreader 131, and the heat sink or heat pipe 135, and how the dies and the heat sink or heat pipe 135 and spreader 131 are stacked in a first direction (e.g., vertically). Also shown is how the processing logic die 106 can be stacked in between the non-volatile memory die 102 and the volatile memory die 108, and how the heat spreader 131 can be stack in between the non-volatile memory die 102 and the processing logic die 106 and the heat sink or heat pipe 135 can be stacked below the dies.

Figure 8:
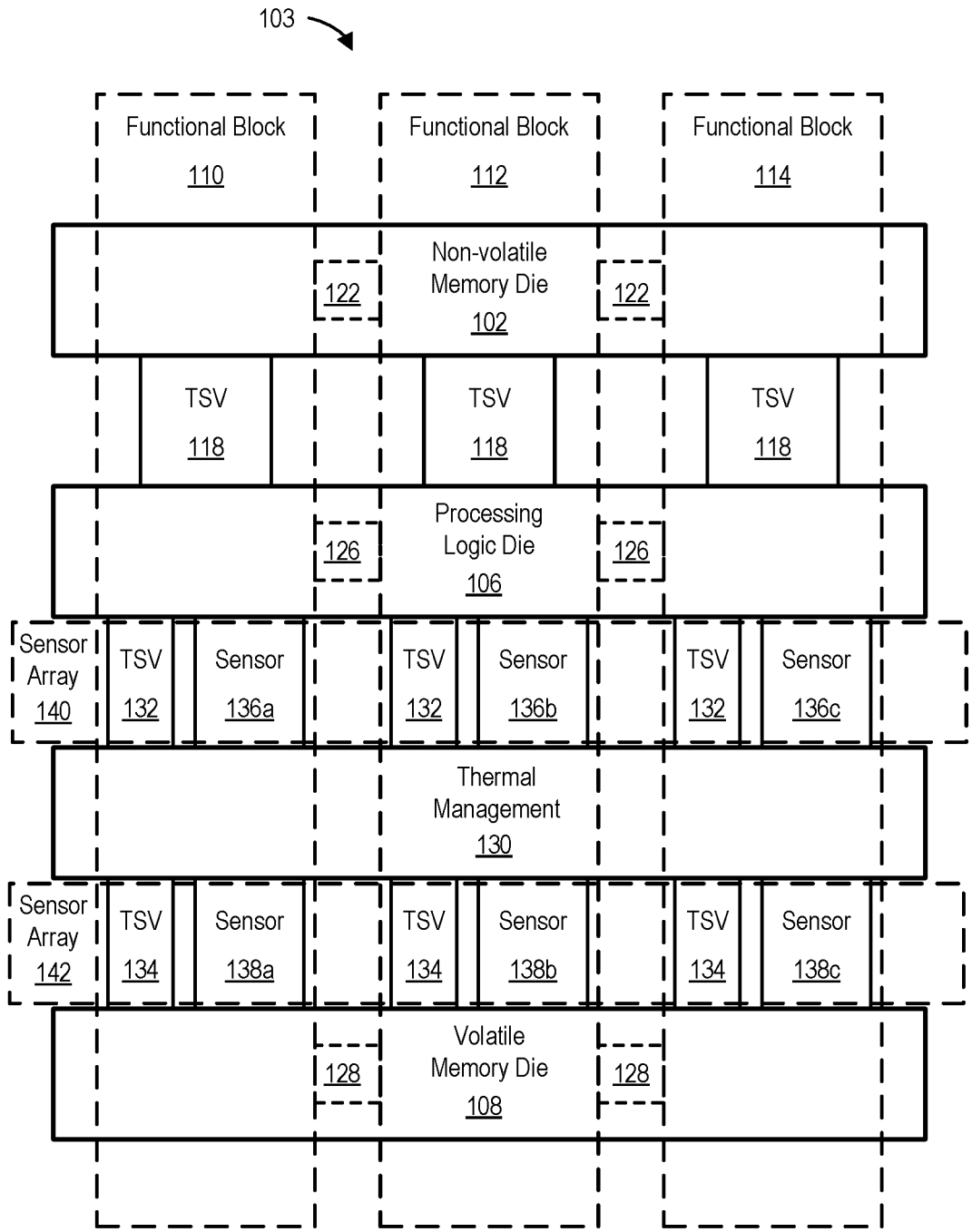
FIG. 8 illustrates a front view of another example 3D SIC having a non-volatile memory die, a volatile memory die, a processing logic die, and a thermal management component in accordance with some embodiments of the present disclosure.

FIG. 8 illustrates a front view of another example 3D SIC 103 having a non-volatile memory die 102, a volatile memory die 108, a processing logic die 106, and a thermal management component 130 in accordance with some embodiments of the present disclosure. 3D SIC 103 is somewhat similar to 3D SIC 100 of FIG. 1, but its thermal management component 130 is positioned in between the processing logic die 106 and the volatile memory die 108. And, FIG. 8 depicts TSVs 118. TSVs 118 and TSVs 132 are parts of single TSVs passing through at least the non-volatile memory die 102 and the processing logic die 106.

FIG. 8 shows functional blocks 110, 112, and 114. FIG. 7 shows the array of functional blocks completely in that all the functional blocks 110, 112, 114, 210, 212, 214, 220, 222, and 224 of the 3D SIC 100 are depicted. It is to be understood that the number of functional blocks of a 3D SIC can vary depending on the embodiment of the 3D SIC. Each functional block of the array of functional blocks illustrated in FIGS. 1-8 can include a respective column of the 3D SIC 100, 101, or 103, as shown. And, as shown by the combination of FIGS. 1-8, a column of the 3D SIC, having a single functional block, can include a respective non-volatile memory partition of the array of non-volatile memory partitions, a respective volatile memory partition of the array of volatile memory partitions, a respective processing logic partition of the array of processing logic partitions, and a respective thermal management partition of the array of thermal management partitions. Also, shown by the combination of these drawings, a respective processing logic partition can be stacked, in a first direction (e.g., vertically), in between a respective non-volatile memory partition and a respective volatile memory partition and a respective thermal management partition can be stacked in between a respective processing logic partition and a respective memory partition.

In some embodiments, each of two abutting functional blocks of the array of functional blocks can have different particular data processing functions that are commonly used together for a greater particular data processing function. Particular data processing functions can include fundamental processes of a CPU, such as decoding processes of a decode operation of CPU.

Embodiments of the 3D IC or at least a group of functional blocks of some embodiments can function as an instruction decoder for a CPU. This way the CPU can reserve resources for fetching and execution operations, when connected to such embodiments of the 3D IC.

Particular data processing functions can also include functions of an arithmetic logic unit of a CPU, such as integer arithmetic and bitwise logic operations. This way the CPU can reserve resources by delegating arithmetic logic unit operations to such embodiments of the 3D IC.

Also, embodiments of the 3D IC or at least a group of functional blocks of some embodiments can function as different types of encoders and/or decoders besides those usually hardwired or programmed into a CPU. For example, embodiments of the 3D IC or at least a group of functional blocks of some embodiments can function as an encryption block wherein the 3D IC or at least a group of functional blocks have a cipher that can generate a ciphertext. Also, embodiments can function as a decryption block. In one embodiment, one or more blocks of the 3D IC can be dedicated to encryption and other one or more blocks of the same 3D IC can be dedicated to decryption. Also, embodiments of the 3D IC or at least a group of functional blocks of some embodiments can function as one or more data processing intensive operations, such as data intensive operations of a type of machine learning.

In some embodiments, processing logic die can include a control unit and an arithmetic/logic unit, and each of the memory ICs can include storage parts that are addressable by an address decoder and/or have predefined addresses. In such embodiments, the control unit is connected in a first direction (e.g., vertically) with the storage parts of the memory ICs and the arithmetic/logic unit is connected in the first direction with the storage parts of the memory ICs and/or the parts of the IC are connected to the storages parts of the memory ICs via an address decoder.

In some embodiments including the control unit and the arithmetic/logic unit, the control unit is configured to, during an instruction time, get instructions from the volatile memory IC of the 3D IC and decode the instructions and direct data to be moved from the volatile memory IC to the arithmetic/logic unit according to at least part of the instructions. And, the arithmetic/logic unit can be configured to, during an execution time, execute the at least part of the instructions and store a result of the execution of the at least part of the instructions in a non-volatile memory IC of the 3D IC.

In such embodiments, the arithmetic/logic unit is given control and performs the actual operation on the data. The combination of instruction time and execution time can be a machine cycle of the 3D IC, and in some embodiments, the control unit can direct, during the execution time, the volatile memory IC and/or the non-volatile memory IC to release the result to an output device or a storage device external of the apparatus. In some embodiments, connections between the control and arithmetic/logic units and the memory units of the memory ICs are connections that can be TSVs. To put it another way, the control unit can be connected in a first direction (e.g., vertically), by a plurality of electrical connections, with the memory elements of the memory ICs and the arithmetic/logic unit is connected in the first direction, by a plurality of electrical connections, with the memory elements of the memory ICs.

The memory cells and logic units of each IC or die of the 3D IC can be connected to each other by a plurality of electrical connections. For example, the 3D SIC can also include a first set of interconnects that connect, in a second direction orthogonal to the first direction, non-volatile memory partitions of the array of non-volatile memory partitions (e.g., interconnects 122 as shown in FIGS. 1 and 2), a second set of interconnects that connect, in the second direction, volatile memory partitions of the array of volatile memory partitions (e.g., interconnects 128 as shown in FIGS. 1 and 3), and a third set of interconnects that connect, in the second direction, processing logic partitions of the array of processing logic partitions (e.g., interconnects 126 as shown in FIGS. 1 and 4). In some embodiments having the three sets of interconnects, an interconnect of the first set of interconnects only connects a non-volatile memory partition of the array of non-volatile memory partitions to another non-volatile memory partition directly next to the non-volatile memory partition (e.g., see interconnects 122 as shown in FIGS. 1 and 2). Also, in such embodiments, an interconnect of the second set of interconnects only connects a volatile memory partition of the array of volatile memory partitions to another volatile memory partition directly next to the volatile memory partition (e.g., see interconnects 128 as shown in FIGS. 1 and 3). And, an interconnect of the third set of interconnects only connects a processing logic partition of the array of processing logic partitions to another processing logic partition directly next to the processing logic partition (e.g., see interconnects 126 as shown in FIGS. 1 and 4).

The 3D SIC can also have multiple non-volatile memory dies (not shown in the drawings). For example, the 3D SIC can include a second non-volatile memory die can include a second array of non-volatile memory partitions. And, each partition of the second array of non-volatile memory partitions can have an array of non-volatile memory cells. In embodiments where the 3D SIC has multiple non-volatile memory dies, the non-volatile memory dies (such as the first and second non-volatile memory dies) can be grouped together such that the processing logic die is in between the volatile memory die and the group of non-volatile memory dies.

In some embodiments of the 3D SIC, each functional block the 3D SIC can have a respective communications interface (i.e., respective port) configured to communicatively couple the block to a bus so that each block can operate in parallel and independently of the other. Additionally or alternatively, groups of at least two functional blocks of the 3D SIC each share a respective port configured to communicatively couple the at least two functional blocks to a bus, so that each group of at least two functional blocks can operate in parallel and independently of another group of at least two functional blocks. Additionally, or alternatively, the 3D SIC can have one or more universal ports configured to communicatively couple any one or all of the functional blocks of the 3D SIC to a bus.

In some embodiments, the 3D SIC can include a processing logic die, a 3D XPoint (3DXP) die, and a dynamic random-access memory (DRAM) die. The processing logic die is stacked between the 3DXP die and the DRAM die. Such a 3D SIC can also include a plurality of through silicon vias (TSVs) that interconnect the processing logic die, the 3DXP die, and the DRAM die and that run through the dies. And, such a 3D SIC can also include a thermal management component that is stacked in between the 3DXP die and the processing logic die and/or stacked in between the DRAM die and the processing logic die. The thermal management component is configured to conduct heat more efficiently than the dies.

In some embodiments, the 3D SIC can include a 3D XPoint (3DXP) die including an array of non-volatile memory partitions, wherein each partition of the array of non-volatile memory partitions includes an array of non-volatile memory cells. Also, it can include a volatile memory die including an array of volatile memory partitions, wherein each partition of the array of volatile memory partitions includes an array of volatile memory cells. Also, it can include a processing logic die including an array of processing logic partitions, wherein the 3DXP die, the volatile memory die, and the processing logic die are stacked in a first direction (e.g., vertically), and wherein the processing logic die is stacked in between the 3DXP die and the volatile memory die. Also, it can include a through silicon via (TSV) that connects and runs through in the first direction, a respective non-volatile memory partition, a respective processing logic partition, and a respective volatile partition in a respective column of the 3D SIC. Further, it can include a thermal management component that is stacked in between the 3DXP die and the processing logic die and/or stacked in between the volatile memory die and the processing logic die. In such an example 3D SIC, the thermal management component is configured to conduct heat more efficiently than the dies.

Also, in some embodiments, the 3D SIC can include an electrical temperature sensor located in between the thermal management component and the processing logic die, and the electrical temperature sensor can be used to measure the temperature of itself and thus indirectly measure a temperature of either a part of the processing logic die, a part of the thermal management component, or a heat exchange medium in between the thermal management component and the processing logic die. The sensor can also be configured to communicate the measured temperature to one of the memory dies. In such embodiments, the 3D SIC can also include a port configured to communicatively couple the volatile memory die to a bus, and the volatile memory die can be configured to store the measured temperature and receive, from the bus through the port, a request of a controller that is configured to instruct the 3D SIC to retrieve the measured temperature. Also, the volatile memory die can be configured to, in response to receiving the request, communicate, via the port, the stored temperature to the bus according to the request.

Further, the electrical temperature sensor can configured to communicate the measured temperature to the non-volatile memory die, and the non-volatile memory die can be configured to receive and store the measured temperature and communicate the stored temperature to the processing logic die upon the processing logic die requesting the stored temperature, in response to the volatile memory die requesting the stored temperature which is in response to the controller requesting the stored temperature via the bus. Also, in some embodiments, the processing logic die can act as the controller. Additionally, the processing logic die of the 3D SIC can be configured to retrieve the stored temperature from the non-volatile memory die via a through silicon via (TSV) connecting the non-volatile memory die and the processing logic die. The processing logic die can also be configured to communicate the retrieved temperature to the volatile memory die via the TSV which also connects the volatile memory die and the processing logic die. And, the volatile memory die can be configured to receive and store the retrieved temperature and communicate, via the port, the stored retrieved temperature to the bus according to the request of the controller.

The controller can be configured to identify whether the usage of the 3D SIC is reduced or normal and whether the retrieved temperature exceeds a predetermined threshold. And, the controller can reduce the usage of the 3D SIC, in response to identifying that the usage of the 3D SIC is normal and the retrieved temperature exceeds the predetermined threshold. The controller can also change the usage of the 3D SIC from the reduced usage to normal usage, in response to identifying that the usage of the 3D SIC is reduced and the retrieved temperature does not exceed the predetermined threshold. And further, the controller can communicate separate requests to the 3D IC to instruct the 3D SIC to measure the temperature of a part of the 3D IC and return the measured temperature, in response to identifying that the usage of the 3D SIC is normal and the retrieved temperature does not exceed the predetermined threshold or in response to identifying that the usage of the 3D SIC is reduced and the retrieved temperature exceeds the predetermined threshold.

More specifically, a respective electrical temperature sensor of a respective functional block of the 3D SIC can be used to measure a respective temperature of the respective processing logic partition, the respective thermal management partition, or a heat exchange medium in between the respective thermal management partition and the respective processing logic partition; and can be configured to communicate the measured respective temperature to the respective memory partition of one of the memory dies. In such an embodiment, a port can be configured to communicatively couple the respective volatile memory partition to a bus. The volatile memory die can be configured to: store the measured respective temperature in the respective volatile memory partition; receive, from the bus through the port, a request of a controller that is configured to instruct the 3D SIC to retrieve the measured respective temperature from the respective volatile memory partition; and in response to receiving the request, communicate, via the port, the stored respective temperature to the bus according to the request.

The respective electrical sensor can be configured to communicate the measured respective temperature to the respective non-volatile memory partition. The respective non-volatile memory partition can be configured to: receive and store the measured respective temperature; and communicate the stored respective temperature to the respective processing logic partition upon the respective processing logic partition requesting the stored respective temperature, in response to the respective volatile memory partition requesting the stored respective temperature which is in response to the controller requesting the stored respective temperature via the bus.

The respective processing logic partition can be configured to: retrieve the stored respective temperature from the respective non-volatile memory partition via a through silicon via (TSV) connecting the respective non-volatile memory partition and the processing logic partition; and communicate the retrieved respective temperature to the respective volatile memory partition via a TSV connecting the respective volatile memory partition and the respective processing logic partition. The respective volatile memory can be configured to: receive and store the retrieved respective temperature; and communicate, via the port, the stored retrieved respective temperature to the bus according to the request of the controller.

Also, in some embodiments, the processing logic die can act as the controller. And, thus no external controller and bus is needed for monitoring and controlling temperature of the 3D IC.

FIG. 9 illustrates a block diagram of an example computer system 600 in which embodiments of the present disclosure can operate. As shown in FIG. 9, the computer system 600 includes the 3D SIC 100 that includes a port 602. The port 602 is communicatively coupled to a bus 604 of the computer system 600. The bus 604 is communicatively coupled to a controller 606 of the computer system 600 (e.g., a CPU or a thermal management unit (TMU) of the system 600) as well as a main memory 608 and network interface 610 of the computer system 600. As shown in FIG. 9, the network interface 610 communicatively couples the computer system 600 to a computer network 612. FIG. 9 also depicts the external thermal management component 614, which can be a fan that sucks or blows air to move through the thermal management component 130 of 3D SIC 100. The fan is especially useful when the thermal management component is a heat sink.

The computer system 600 can be or include a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that computerized system. Further, while a single computer system 600 is illustrated, the term "computer system" shall also be taken to include any collection of computer systems. The bus 604 can be or include multiple buses. The controller 606 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Controller 606 can also be one or more special-purpose processing devices such as an application specific integrated circuit (ASIC), a FPGA, a digital signal processor (DSP), network processor, or the like. The main memory 608 can be a read-only memory (ROM), flash memory, DRAM such as synchronous DRAM (SDRAM) or Rambus DRAM (RDRAM), and/or SRAM.

Referring to FIGS. 1 and 6, in some embodiments, the port 602 can be configured to communicatively couple the volatile memory die 108 to the bus 604. In such an arrangement, the controller 606 can delegate data processing functions to the 3D SIC 100 via the bus 604 and the volatile memory die 108. The delegated data processing functions can be data intensive functions or commonly used functions of the controller 606. As mentioned, in some embodiments, the processing logic IC or die does not have a full array of processing cores that a typical CPU would have. But, in such embodiments, the processing logic can implement frequently used functions and/or data intensive functions; thus, having potential to relieve the CPU of significant processing duties and enhancing the performance of the CPU. Also, in the depicted embodiments, a functional block cannot execute complete set of multifunctional instructions on its own. Therefore, a functional block and the remainder of the 3D SIC 100 can be connected to a controller (such as a CPU) and the controller can instruct the function block to do a task it is configured to do.

For example, a functional block of example embodiments can be configured to decrypt, by its processing logic partition, the data stored in its corresponding non-volatile memory partition, and insert the decrypted data into its corresponding volatile partition to be communicated to the controller for further processing by controller.

Also, in general, the controller can provide a request to the volatile memory partition of a functional block to request the block to generate a result of a certain function, and the controller can also provide a second or follow-up request to retrieve the result from the functional block. For instance, the request for generation of the result can be provided from the controller to the functional block in the form of a write command, and the request to retrieve the result can be provided from the controller to the functional block in the form of a read command.

Figure 10:
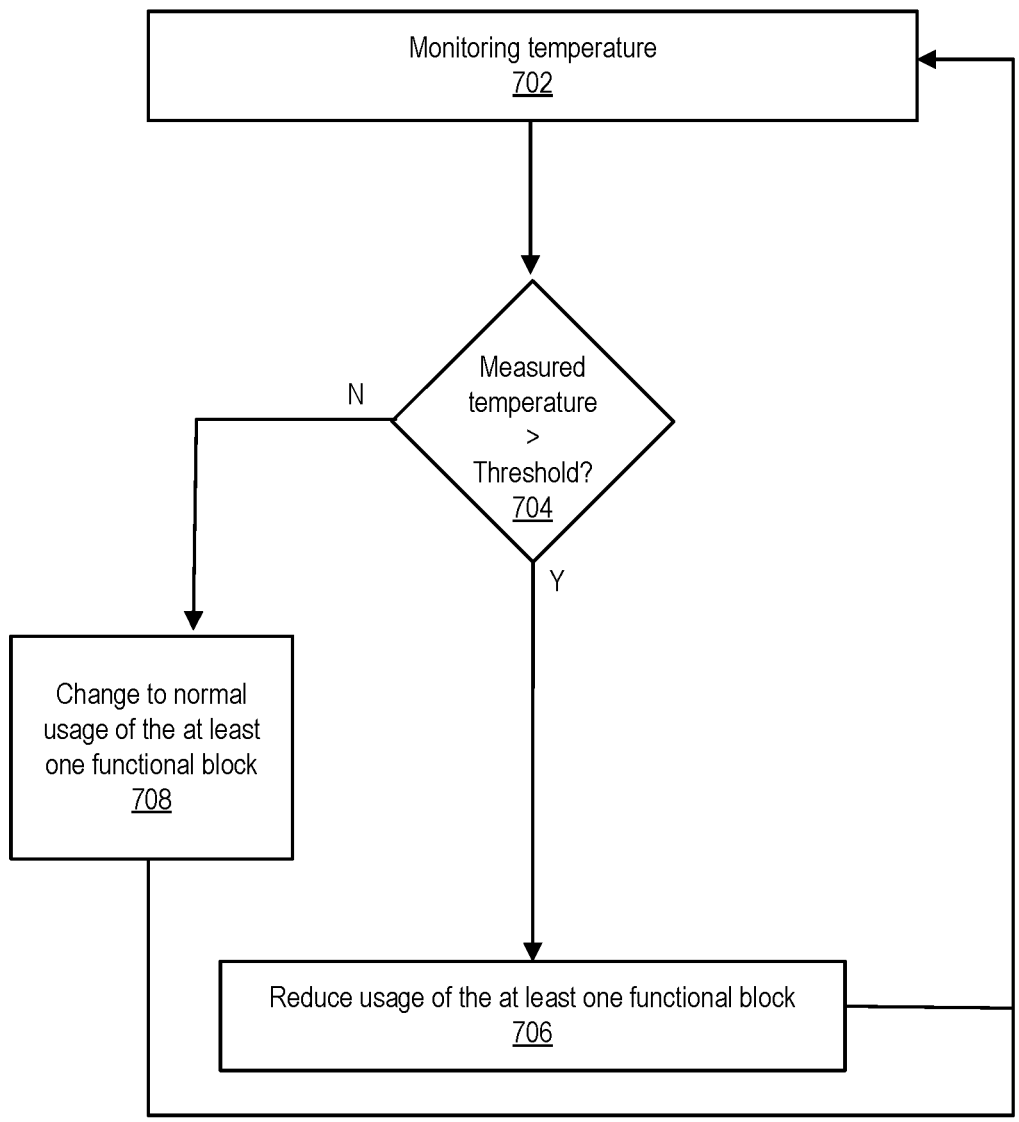
FIG. 10 illustrates a flow diagram of an example method in accordance with some embodiments of the present disclosure.

FIG. 10 illustrates a flow diagram of an example method 700 in accordance with some embodiments of the present disclosure. The method 700 in general can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. And, not all processes are required in every embodiment. Other process flows are possible as well. Specifically, in some embodiments, the method 700 can be performed by the controller 606. Also, in some embodiments, the method 700 can be performed by the processing logic layer of the 3D IC, such as the processing logic die 106 of the 3D SIC 100.

At block 702 of method 700, hardware and/or software (such as processing logic die 106 or controller 606) monitors temperature at one or more parts of the 3D IC. The hardware and/or software monitoring the temperature receives temperature measurements from electrical temperature sensors within the 3D IC. In examples where the monitoring device is an external device, such as the controller 606, the controller can request the 3D IC to measure temperature at least at one functional block of the 3D IC. For example, the controller 606 can request the 3D SIC 100 to measure temperature of a part of the functional block by the respective electrical temperature sensor of the block. Also, with such an example, the external controller can request the 3D IC to return temperature the measured temperature. And, the external controller can receive the measured temperature. Also, the external controller can identify whether the usage of the at least at one functional block is reduced or normal. Analogously, in some embodiments, the processing logic layer of the 3D IC can perform similar operations.

At blocks 704, the hardware and/or software identifies whether the measured temperature exceeds a predetermined threshold.

At block 706, the hardware and/or software controls the 3D IC to reduce the usage of the 3D SIC, in response to identifying that the retrieved temperature exceeds the predetermined threshold.

At block 708, the hardware and/or software controls the 3D IC to change the usage of the 3D SIC from the reduced usage to normal usage, in response to identifying that the retrieved temperature does not exceed the predetermined threshold. It is to be understood that the temperature can be continually monitored or periodically monitored by a schedule.

Figure 11:
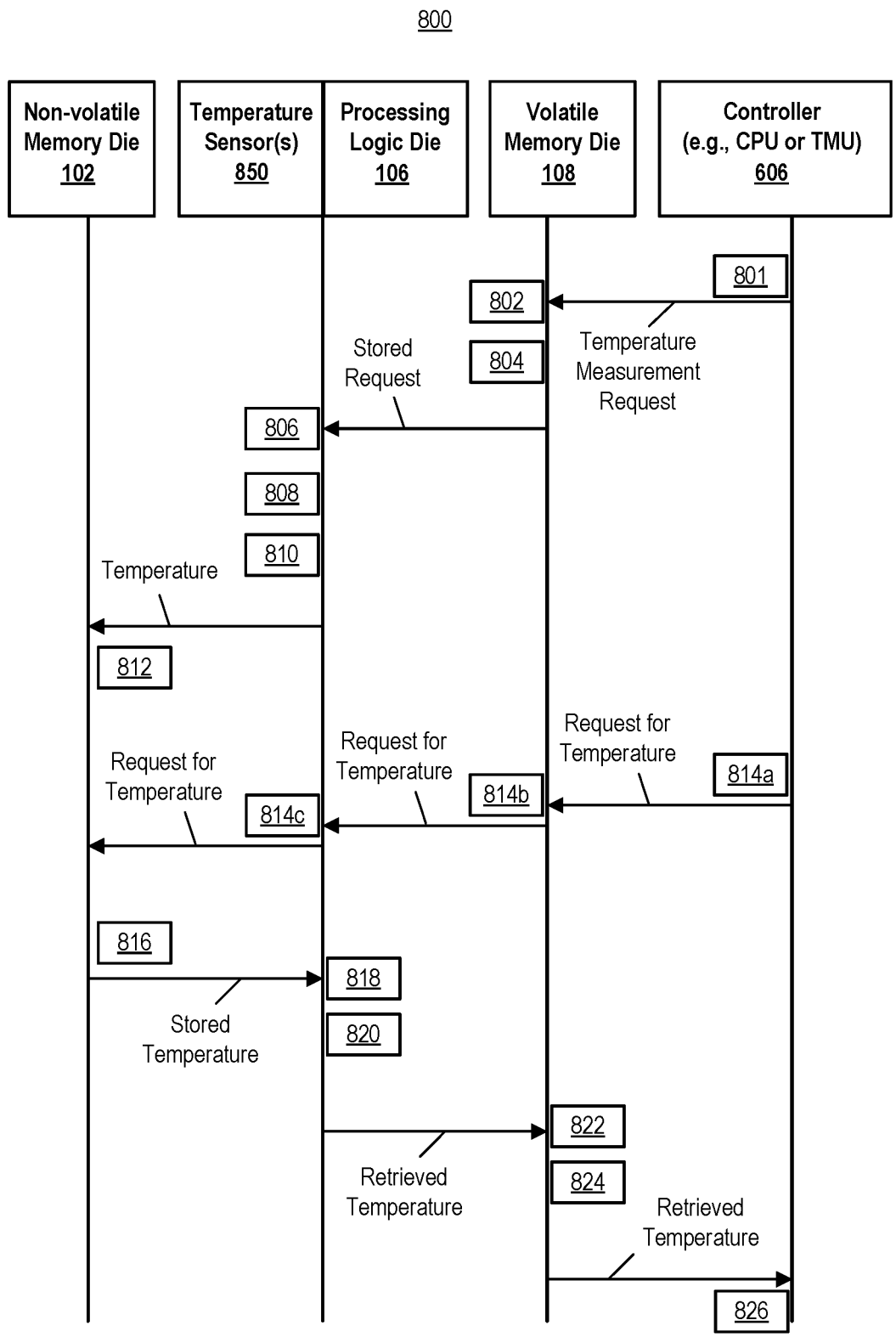
FIG. 11 illustrates a flow diagram of an example method in which embodiments of the present disclosure can perform along with a controller.

FIG. 11 illustrates a flow diagram of an example method 800 in which embodiments of the present disclosure can perform along with the controller 606. The method 800 in general can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order and performed by particular hardware/software, unless otherwise specified, the order and hardware/software of the processes can be modified. Thus, the illustrated embodiments should be understood only as examples, and the illustrated processes can be performed in a different order and/or by different hardware/software, and some processes can be performed in parallel. Additionally, one or more processes can be omitted in various embodiments. Thus, not all processes are required in every embodiment. Other process flows are possible as well.

Specifically, the method 800 can be performed by at least the non-volatile memory die 102, the processing logic die 106, the volatile memory die 108, electrical one or more temperature sensors 850 (e.g., one or more of electrical temperature sensors 136*a*, 136*b*, 136*c*, 136*d*, 136*e*, 136*f*, 136*g*, 136*h*, and 136*i*), and the controller 606 (as illustrated in FIG. 11). At block 801 of FIG. 11 (which is somewhat similar to the operation of block 702 of FIG. 10), the controller 606 communicates a request, via a bus (such as bus 604), to the 3D SIC. The request of the controller 606 is configured to instruct the 3D SIC to generate a measured temperature at least at one functional block. Such a request can be delivered to the 3D SIC via a write command of the controller 606. For example, if a write command is used by the controller 606 to make the request, then the request is sent to the selected volatile memory partition of the volatile memory die 108. Alternatively, an execute command can be used by the controller 606 to make the request, and in such instances the request can be directly sent to the selected processing logic partition of the processing logic die 106.

At block 802, the volatile memory die 108 receives the request via the bus. The volatile memory die 108 can be configured to receive, from the bus through the port 602, the request of the controller. In addition to being configured to instruct the 3D SIC to generate the measured temperature, the request can include at least one input parameter of the request to measure temperature (such as the particular one or more functional blocks to monitor and control by the method 700). At block 804, the volatile memory die 108 stores the request and communicates the request to the processing logic die 106. The volatile memory die 108 can be configured to store the request in at least one volatile partition of the volatile memory die.

At block 806, the stored request is received by the processing logic die. And, at block 806, the at least one input parameter of the particular data processing function can be received by the at least one processing logic partition through a TSV connecting the at least one volatile partition of the volatile memory die and the at least one processing logic partition.

At block 808, the processing logic die 106 generates the measured temperature by controlling the one or more respective temperature sensors 850 to measure the temperature at the least at one functional block and retrieving the measured temperature, accordingly to the stored request. The one or more respective temperature sensors 850 can be used to measure a respective temperature of the respective processing logic partition, the respective thermal management partition, or a heat exchange medium in between the respective thermal management partition and the respective processing logic partition of the at least one functional block. The sensor(s) 850 can also be configured to communicate the measured temperature to the respective memory partition of one of the memory dies. At least one processing logic partition of the processing logic die 106 can include a particular data processing function and the particular data processing function can generate the measured temperature in conjunction with temperature sensors according to the stored request and the at least one input parameter of the particular data processing function. The particular data processing function can be hardwired into the at least one processing logic partition of the processing logic die. Alternatively, the particular data processing function can be configured, by the controller 606 or another controller, in the at least one processing logic partition of the processing logic die temporarily. For example, the particular data processing function can be implemented by a FPGA configurable by the controller 606 or another controller.

At block 810, the processing logic die 106 communicates the measured temperature to the non-volatile memory die 102 (depicted in FIG. 11) and/or the non-volatile memory die 104 (not depicted). The processing logic die 106 can be configured to communicate the measured temperature to the non-volatile memory die via the TSV connecting at least one non-volatile partition of the non-volatile memory die and the at least one processing logic partition.

At block 812, the non-volatile memory die 102 receives and stores the measured temperature that is communicated from the processing logic die 106. The non-volatile memory die 102 can be configured to store the measured temperature in at least one non-volatile partition and communicate the stored result to the processing logic die 106 upon the processing logic die requesting the stored result. The processing logic die 106 requesting the stored result can be in response to the volatile memory die 108 requesting the stored result which can be in response to the controller 606 requesting the stored result via the bus 604 (e.g., see block 704 where the controller requests the measured temperature be returned to the controller).

The processing logic die 106 can be configured to retrieve the stored temperature from the non-volatile memory die via a TSV connecting the at least one non-volatile partition and the at least one processing logic partition. And, the 3D SIC can be configured to communicate the retrieved result to the volatile memory die via the TSV that can also connect the at least one volatile partition and the at least one processing logic partition. The volatile memory die can be configured to receive and store the retrieved temperature in the at least one volatile partition, and communicate, via the port, the stored retrieved temperature to the bus according to a second request of the controller, when the second request of the controller is configured to instruct the 3D SIC to retrieve a result generated by the particular data processing function (e.g., see block 704 where the controller requests the measured temperature be returned to the controller). In some examples, where a read command is used by the controller 606 to make the second request, the second request is sent to the selected volatile memory partition of the volatile memory die 108.

With respect to FIG. 11, at block 814*a*, the controller 606 communicates the second request that is configured to instruct the 3D SIC to retrieve the measured temperature generated by the particular data processing function of the processing logic partition. At block 814*b*, the second request is received, stored, and sent to the processing logic die 106, by the volatile memory die 108. At block 814*c*, the second request is received, stored, and forwarded to the non-volatile memory die 102 and/or the non-volatile memory die 104, by the processing logic die 106.

At block 816, in response to block 814*c*, the non-volatile memory die 102 communicates the stored measure temperature to the processing logic die 106. At block 818, the processing logic die 106 receives the retrieved temperature, and at block 820, the processing logic die 106 communicates the retrieved temperature to the volatile memory die 108. The processing logic die 106 can be configured to retrieve the stored temperature from the non-volatile memory die via the TSV connecting the at least one non-volatile partition and the at least one processing logic partition. And, the processing logic die 106 can be configured to communicate the retrieved temperature to the volatile memory die via the TSV connecting the at least one volatile partition and the at least one processing logic partition.

At block 822, the volatile memory die 108 receives and stores the retrieved temperature sent from the processing logic die 106. At block 824, the retrieved temperature is then communicated to the controller 606, by the volatile memory die 108. The volatile memory die can be configured to receive and store the retrieved temperature in the at least one volatile partition as well as be configured to communicate, via the port, the stored retrieved temperature to the bus according to a second request of the controller configured to instruct the 3D SIC to retrieve the measured temperature generated by the particular data processing function ran by the processing logic partition.

At block 826, the controller 606 receives the retrieved measured temperature. Block 826 is similar to block 706 of FIG. 10. The retrieve measured temperature can be used by the controller 606 for another processing step or outputted by the controller to another device. For example, the retrieve measured temperature can be used as input for the blocks 708, 710, and 712 of method 700 to control the usage the at least one functional block according to the retrieved measured temperature at the at least one functional block.

In such embodiments, at least two of a volatile partition, a non-volatile partition, and a processing logic partition can be in the same one or more columns of the 3D SIC. For example, a volatile partition, a non-volatile partition, and a processing logic partition used together can be in the same one or more columns of the 3D SIC. Also, in some embodiments, each of two abutting functional blocks of the array of functional blocks can have different sub-particular data processing functions of the particular data processing function.

Besides controlling and monitoring functional blocks of the 3D SIC 100 according to temperatures measured at the blocks, a particular data processing function requested by the controller for the 3D SIC to perform can include a fundamental process of the controller. For example, if the controller 606 is a CPU, the fundamental process can be a decoding process of the decode operation of a CPU. The processing logic die 106 can be programmed or hardwired as a decoder for a CPU or at least a common part or data intensive part of a decoder for a CPU. This way a CPU can reserve resources for fetching and execution operations, when connected to the 3D SIC 100.

The particular data processing function can also include the processing logic providing at least part of the functionality of an arithmetic logic unit of a CPU and such functionality can be programmed or hardwired into the processing logic die 106. And, abutting partitions of the processing logic die 106 can provide sub-operations of an arithmetic logic unit such as different integer arithmetic and bitwise logic operations. This way the CPU can reserve resources by delegating arithmetic logic unit operations to the 3D SIC 100.

Also, the processing logic die 106 can function as different types of encoders and/or decoders besides those usually hardwired or programmed into a CPU. For example, with embodiments of the 3D SIC 100 or at least a group of functional blocks of some embodiments, the 3D SIC 100 can provide an encryption function wherein the 3D IC or at least a group of functional blocks have a cipher hardwired or programmed into the processing logic die 106 so that the die can generate a ciphertext and then the ciphertext can be stored immediately in the non-volatile memory die 102 of the 3D SIC 100 for subsequent retrieval by the controller 606. And, the processing logic die 106 or partitions of the die can function as a decryption algorithm. In one embodiment, one or more blocks of the 3D SIC 100 can be dedicated to encryption and other one or more blocks of the 3D IC can be dedicated to decryption.

Also, the 3D SIC 100 or at least a group of functional blocks of some embodiments can function as one or more certain data processing intensive operations, such as selected data intensive operations of a type of machine learning. And, data intensive operations that are immediately preceding or following each other in a machine learning algorithm or another type of complex computerized algorithm can be implemented by blocks of the 3D SIC 100 that are abutting each other. Thus, speeding up the transitional time between operations of an algorithm as well as providing other benefits such as reduced power consumption.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
   a non-volatile memory die;
   a logic die;
   a volatile memory die, wherein the volatile memory die is arranged with the non-volatile memory die and the logic die; and
   an electrical temperature sensor configured to measure a temperature of a part of the logic die.

2. The apparatus of claim 1, wherein the volatile memory die is stacked with the non-volatile memory die and the logic die.

3. The apparatus of claim 1, wherein the volatile memory die is arranged with the non-volatile memory die and the logic die to form the array of functional blocks.

4. The apparatus of claim 1, further comprising:
   a thermal management component having a different thermal conductivity than the dies;
   wherein the thermal management component is stacked with the non-volatile memory die and the logic die.

5. The apparatus of claim 1, wherein the temperature sensor is further configured to communicate the measured temperature to the volatile memory die, and the volatile memory die is further configured to store the measured temperature.

6. The apparatus of claim 1, wherein the electrical temperature sensor is a first electrical temperature sensor configured in an array of electrical temperature sensors, and each sensor of the array is coupled to a respective through silicon via (TSV) by a communicative coupling between the TSV and the respective sensor.

7. The apparatus of claim 1, wherein:
   the logic die comprises an array of logic partitions including a first logic partition; and
   the electrical temperature sensor is further configured to measure a first temperature of the first logic partition, and communicate the first temperature to a memory partition of the non-volatile memory die.

8. The apparatus of claim 1, further comprising:
   a heat exchange medium between the non-volatile memory die and the logic die;
   wherein the electrical temperature sensor is further configured to measure a first temperature of the heat exchange medium, and communicate the first temperature to the non-volatile memory die.

9. The apparatus of claim 1, wherein the measured temperature is a first temperature, the apparatus further comprising:
   a port configured to communicatively couple the volatile memory die to a controller;
   wherein the electrical temperature sensor is further configured to measure a second temperature, and communicate the second temperature to the volatile memory die;
   wherein the volatile memory die is configured to:
     store the second temperature;
     receive, via the port, a request of a controller for the second temperature; and
     in response to receiving the request, communicate, via the port, the second temperature to the controller.

10. The apparatus of claim 9, wherein the controller is configured to:
    in response to receiving the second temperature, identify whether the second temperature exceeds a predetermined threshold; and
    in response to identifying that the second temperature exceeds the predetermined threshold, reduce usage of at least one of the functional blocks.

11. An apparatus comprising:
    a non-volatile memory die;
    a volatile memory die;
    a thermal management component having a different thermal conductivity than the dies; and
    a logic die.

12. The apparatus of claim 11,
    wherein the thermal management component is stacked with the non-volatile memory die, the volatile memory die, and the logic die.

13. The apparatus of claim 11, further comprising an electrical temperature sensor configured to measure a temperature, and communicate the measured temperature to one of the non-volatile memory die and volatile memory die.

14. The apparatus of claim 13, further comprising a heat exchange medium between the non-volatile memory die and the logic die, wherein the measured temperature is a temperature of the heat exchange medium.

15. The apparatus of claim 13, further comprising a controller configured to:
    request the measured temperature;
    in response to receiving the measured temperature, identify whether the measured temperature exceeds a predetermined threshold; and
    in response to identifying that the measured temperature exceeds the predetermined threshold, reduce usage of at least one of the functional blocks.

16. The apparatus of claim 13, wherein the logic die is configured to:
    identify whether the measured temperature exceeds a threshold; and
    in response to identifying that the measured temperature exceeds the threshold, reduce usage of at least a first functional block.

17. The apparatus of claim 16, wherein the logic die is further configured to:
    in response to identifying that the measured temperature does not exceed the threshold, change usage of the first functional block from reduced usage to normal usage.

18. An apparatus comprising:
a non-volatile memory die;
a volatile memory die;
a logic die; and
temperature sensors, each temperature sensor configured to measure a respective temperature, and communicate the measured temperature to the non-volatile memory die or the volatile memory die;
wherein the non-volatile memory die, the volatile memory die, and the logic die are stacked;
wherein the temperature sensors are used to determine a temperature distribution.

19. The apparatus of claim 18, wherein:
the non-volatile memory die, the volatile memory die, and the logic die are arranged to form an array of functional blocks; and
usage of at least one of the functional blocks is reduced based on a first temperature measured by one of the temperature sensors.

20. The apparatus of claim 19, wherein the usage is reduced by a controller in response to identifying that the first temperature exceeds a threshold.

21. The apparatus of claim 18, wherein:
usage of at least one of the dies is reduced based on the temperature distribution.

22. The apparatus of claim 18, wherein the temperature sensors are formed on at least one of the non-volatile memory die and volatile memory die.

23. The apparatus of claim 18, wherein the temperature sensors are positioned in a plane parallel to the dies.

24. The apparatus of claim 18, further comprising:
a thermal management component having a different thermal conductivity than the dies;
wherein the thermal management component is stacked with the non-volatile memory die, the volatile memory die, and the logic die.

25. The apparatus of claim 18, further comprising a thermal management component, wherein the respective temperature measured by each temperature sensor is a temperature of a part of the thermal management component.

* * * * *